(12) United States Patent
Suzuki et al.

(10) Patent No.: US 6,429,476 B2
(45) Date of Patent: Aug. 6, 2002

(54) SEMICONDUCTOR INTEGRATED CIRCUIT DEVICE

(75) Inventors: Masayuki Suzuki, Kokubunji; Kentaro Yamada; Masashi Sahara, both of Hitachinaka; Takashi Nakajima, Chiyoda; Naoki Kanda, Sagamihara; Hidenori Suzuki, Tachikawa; Yoshinori Matsumuro, Hitachinaka, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/795,190

(22) Filed: Mar. 1, 2001

(30) Foreign Application Priority Data

Mar. 1, 2000 (JP) .......................... 2000-055621

(51) Int. Cl.[7] .......................................... H01L 27/108
(52) U.S. Cl. ....................... 257/296; 257/203; 257/390; 257/306
(58) Field of Search ................................ 257/296, 306, 257/203, 390; 438/253, 254, 255, 396, 397, 398

(56) References Cited

U.S. PATENT DOCUMENTS

| | | | | | |
|---|---|---|---|---|---|
| 4,898,840 A | * | 2/1990 | Okuyama | .................... | 257/203 |
| 5,063,170 A | * | 11/1991 | Okuyama | .................... | 257/390 |
| 6,150,689 A | * | 11/2000 | Narui et al. | ................ | 257/306 |
| 6,168,985 B1 | * | 1/2001 | Asano et al. | ................ | 438/241 |

FOREIGN PATENT DOCUMENTS

JP              11214650              8/1999

* cited by examiner

*Primary Examiner*—David Nelms
*Assistant Examiner*—Long K. Tran
(74) *Attorney, Agent, or Firm*—Antonelli, Terry, Stout & Kraus, LLP

(57) ABSTRACT

Bit lines BL of a DRAM that are narrowed to 0.1 $\mu$m or less are made of two-layered conductive films, in which a W (tungsten) film is deposited on a WN (tungsten nitride) film. For bit lines BL, fewer W atoms diffuse across the interface between the W film and the WN film, within crystal grains, and at grain boundaries of the W film, and no tensile stress exists in the W film. Therefore, high-temperature thermal processing in the capacitor formation process does not cause wiring breaks even when the width of the bit lines BL is narrowed to 0.1 $\mu$m or less.

2 Claims, 26 Drawing Sheets

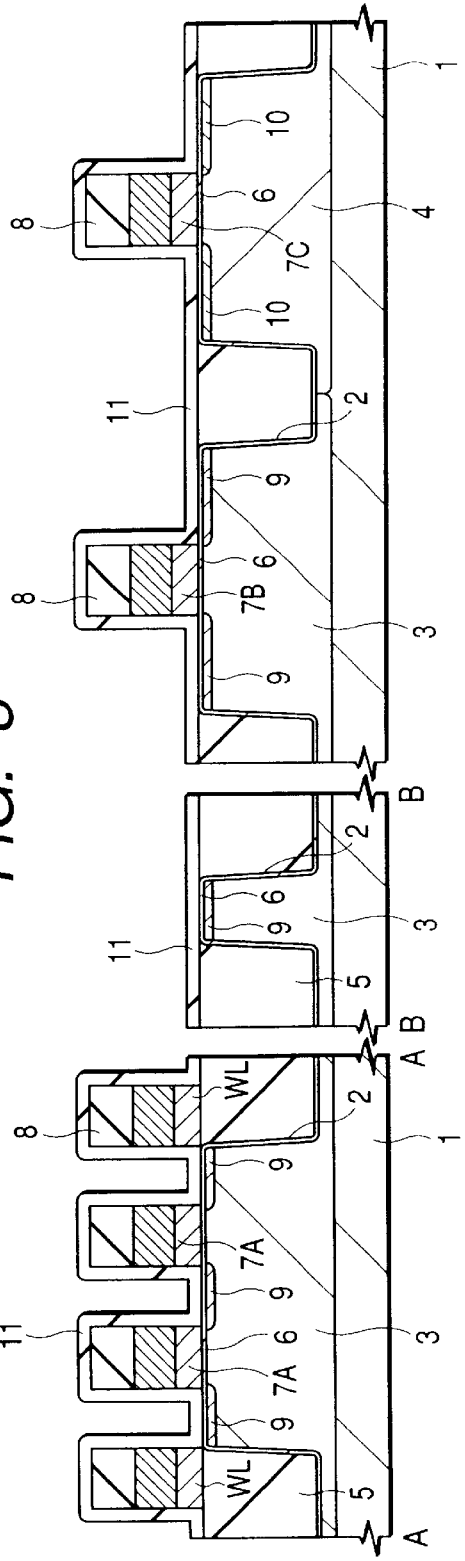
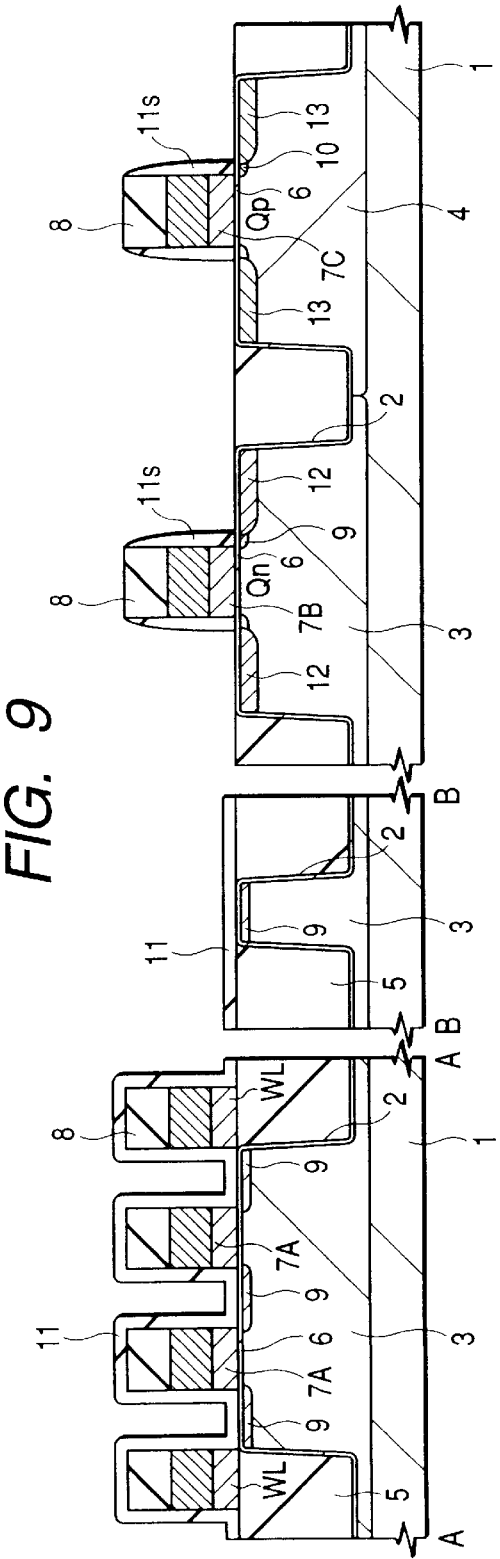

SEMICONDUCTOR INTEGRATED CIRCUIT DEVICE

BACKGROUND OF THE INVENTION

This invention relates to a semiconductor integrated circuit device and to the method of its fabrication; and, more particularly, the invention relates to a semiconductor integrated circuit having a DRAM (dynamic random access memory) with miniaturized memory cells A DRAM memory cell, which is formed at the intersection of word lines and bit lines that are provided in a matrix pattern over the major surface of a semiconductor substrate, comprises a single memory-cell-selecting MISFET (metal-insulator-semiconductor field-effect transistor) and a single data-storage capacitor connected in series thereto. The memory-cell-selecting MISFET mainly comprises a gate oxide film, a gate electrode that is configured in a single unit with a word line, and a pair of semiconductor regions that form the source and drain regions. The bit line, which is provided over the memory-cell-selecting MISFET, is electrically connected to either the source region or the drain region. The data-storage capacitor, which is also provided over the memory-cell-selecting MISFET, is electrically connected to the other region, source or drain.

To compensate for the reduction in the capacitance of the data-storage capacitor, which accompanies the miniaturization of the memory cells, a stacked capacitor configuration, in which the data-storage capacitor is provided over the memory-cell-selecting MISFET, has been used in the DRAMs of recent years. The stacked capacitor configuration can roughly be classified into the following two configurations: a capacitor under-bit-line (CUB) configuration in which the data-storage capacitor is provided below the bit line, and a capacitor-over-bit-line (COB) configuration in which the data-storage capacitor is provided over the bit line.

In order to increase the capacitance of the data-storage capacitor, the surface area of the data-storage capacitor must be increased by an upward elongation of the capacitor's semiconductor form. In this case, however, if the CUB configuration, in which the data-storage capacitor is provided below the bit line, is to be employed, the aspect ratio of the contact hole that connects the bit line and the memory-cell-selecting MISFET significantly increases, and, as a result, the complete formation of the hole will become difficult. Accordingly, when the above two stacked capacitor configurations are compared, the COB configuration, in which the data-storage capacitor is provided over the bit line, is more suitable for the miniaturization of memory cells than the CUB configuration.

In the large-scale DRAMs that have appeared recently, for example, 64-Mbit DRAMs and 256-Mbit DRAMs, it has become difficult to obtain enough storage capacitance by applying a simple upward elongation of the data-storage capacitor's configuration to increase its surface area. Accordingly, the use of a material with a high-dielectric constant for a capacitance-insulating film has been investigated. Such materials include $Ta_2O_5$ (tantalum pentoxide), (Ba, Sr) $TiO_3$ (barium strontium titanate; hereinafter abbreviated as BST), or $SrTiO_3$, (strontium titanate; hereinafter abbreviated as STO).

In official Patent Gazettes H. 11-186518, that corresponds to U.S. application Ser. No. 9/209,013 (filed on Dec. 11, 1998), and H. 11-238862, that corresponds to U.S. application Ser. No. 9/215,270 (filed on Dec. 18, 1998), a DRAM having COB memory cells is disclosed. The process of fabricating the DRAM disclosed in these Official Patent Gazettes has been simplified, in that the bit line and the first-layer wiring of the peripheral circuits are formed in the same single step. The bit line and the first-layer wiring are made of, for example, a two-layered conductive film in which a W (tungsten) film is deposited over a TiN (titanium nitride) film.

In the DRAM disclosed in official Patent Gazette H. 11-186518, when the bit line and the first-layer wiring are formed by patterning the two-layered conductive film, the TiN film that configures part of the bit line and part of the first-layer wiring of the peripheral circuits is utilized as an etching stopper that can prevent etching of the W plug inside the contact hole that connects the first-layer wiring with the MISFET of the peripheral circuits. In the DRAM disclosed in the Official Patent Gazette H. 11-238862, the first-layer wiring of the peripheral circuits is connected to the source and drain of the MISFET without the interposition of a plug. In this configuration, the TiN film under the W film is utilized as a barrier material to prevent the forming of an undesirable silicide layer as a result of reaction at the interface between the W film and the silicon substrate.

In the Official Gazette H. 11-214650, a DRAM is disclosed wherein the bit line and the first-layer wiring of the peripheral circuits are formed concurrently by a so-called Damascene method. In the Damascene method, a two-layered conductive film, comprising a WN (tungsten nitride) film and a W film that is deposited over that, is embedded inside the wiring groove that is formed in the insulating film. In this case, the WN film under the W film acts not only as an adhesive film between the W film and the insulating film in the Damascene configuration, but also as a barrier material which prevents the growth of an undesirable silicide layer at the interface between the W film and the silicon substrate.

SUMMARY OF THE INVENTION

The DRAM configuration to which the method of the present invention is applied is characterized by:

a COB configuration in which the data-storage capacitor is formed over the bit line so that the capacitance of the data-storage capacitor can be secured;

a high-dielectric film, for example $Ta_2O_5$, (tantalum pentoxide), as a capacitance-insulating film;

a refractory-metal bit line, for example W, the low resistivity of which improves the signal delay quality; and a concurrent forming of the bit line and the first-layer wiring of the peripheral circuit, which reduces the number of fabrication process steps.

In a DRAM of this configuration, since a through hole that electrically connects the data-storage capacitor with the memory-cell-selecting MISFET is formed between adjacent bit lines, the width of the bit line needs to be reduced to 0.1 $\mu$m or less to ensure a margin against the possibility of a short-circuit forming between the bit line and the plug that has been embedded inside the through hole.

When forming a 0.1-$\mu$m-or-narrower bit line by patterning the W film that has been deposited over the insulating film, for example, silicon oxide, the inventors have found that a segregation occurs at the grain boundaries of the W that forms the bit line when high-temperature processing is applied to crystallize the high-dielectric constant material, for example $Ta_2O_5$, which forms the capacitance-insulating film of the data-storage capacitor.

The object of this invention is to provide a technique that can effectively prevent wiring breaks in the bit lines of a DRAM that has miniaturized memory cells.

The object and novel features of this invention will be clarified by the following description together with the accompanying drawings. A typical example of the invention disclosed in this application is briefly summarized in the following.

The semiconductor integrated circuit device of this invention comprises: memory cells including, a memory-cell-selecting MISFET, which is formed over the major surface of a semiconductor substrate, with a gate electrode that is configured a single unit with a word line; and a data-storage capacitor that is formed over a second insulating film which covers the bit line and that is electrically connected to the other part, either source or drain, of the memory-cell-selecting MISFET; and a bit line that is formed over a first insulating film which covers the memory-cell-selecting MISFET and that is electrically connected to either the source or drain of the memory-cell-selecting MISFET; wherein compressive stress is applied to the conductive film that configures the bit line.

The semiconductor integrated circuit device of this invention comprises: memory cells including, a memory-cell-selecting MISFET, which is formed over the major surface of a semiconductor substrate, with a gate electrode that is configured in a single unit with a word line; and a data-storage capacitor that is formed over a second insulating film which covers the bit line and that is electrically connected to the other part, either source or drain, of the memory-cell-selecting MISFET; and a bit line that is formed over a first insulating film which covers the memory-cell-selecting MISFET and that is electrically connected to either the source or drain of the memory-cell-selecting MISFET; wherein the bit line is made of a first conductive film of a w compound and a second conductive film of W that is deposited on the first conductive film, and the width of the bit line is 0.1 $\mu$m or less.

The method fabrication of a semiconductor integrated circuit device of this invention comprises the steps of:

(a) forming a memory-cell-selecting MISFET with a gate electrode that is configured in a single unit with a word line over the major surface of a semiconductor substrate;

(b) forming a first insulating film over the memory-cell-selecting MISFET, forming a first conductive film over the first insulating film, and forming a second conductive film over the first conductive film; and (c) forming an etching-resistant film over the second conductive film, and thinning the etching-resistant film; and (d) forming bit lines made of the first and second conductive films by using a narrow etching-resistant film as a mask in etching the first and second conductive films.

BRIEF DESCRIPTION OF THE DRAWINGS

FIG. 8 is a cross-sectional view through the key parts of the semiconductor substrate that shows the method of fabricating the DRAM which is one embodiment of this invention.

FIG. 9 is a cross-sectional view through the key parts of the semiconductor substrate that shows the method of fabricating the DRAM which is one embodiment of this invention.

DESCRIPTION OF THE PREFERRED EMBODIMENT

This invention will be described below in detail based on the embodiment that is shown in the accompanying drawings.

Identical numerical references in the figures describing the embodiment refer to the same items and their descriptions are not repeated. In addition, as a rule, descriptions of identical or similar sections are not repeated except where they are necessary.

Figure 1:
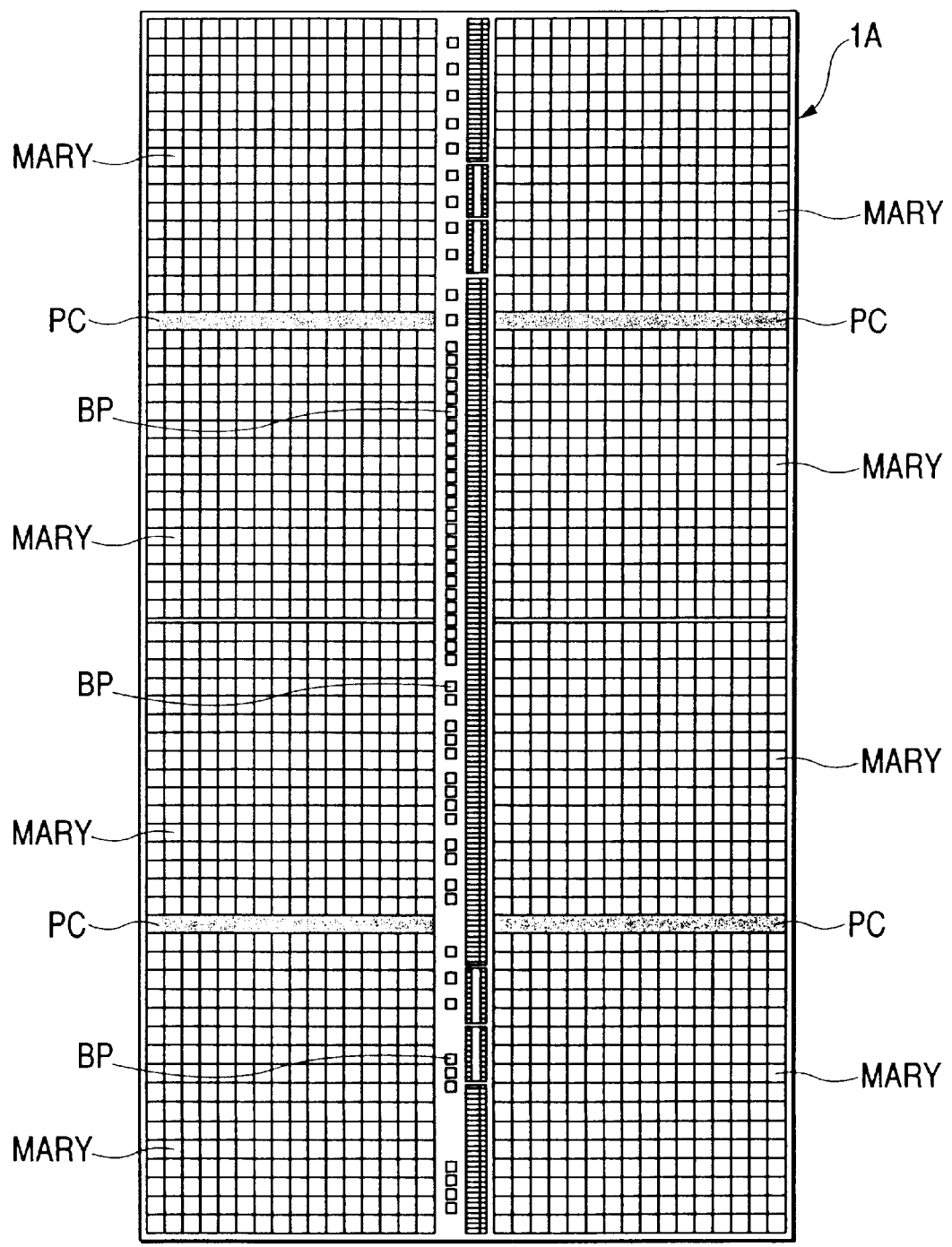
FIG. 1 is a plan view of the whole semiconductor chip over which the DRAM, which is one embodiment of this invention, is formed.

FIG. 1 is a plan view of the whole semiconductor chip 1A over which a DRAM of this embodiment has been formed. A DRAM with a storage capacity of 256 Mbits is formed over the major surface of rectangular semiconductor chip 1A. This DRAM comprises the storage section made up mainly of memory arrays (MARY) and peripheral circuits PC that are provided at the periphery outside the storage section. In the center of semiconductor chip 1A, a number of bonding pads BP that will be connected to wires or bump electrodes are provided in a single line.

Figure 2:
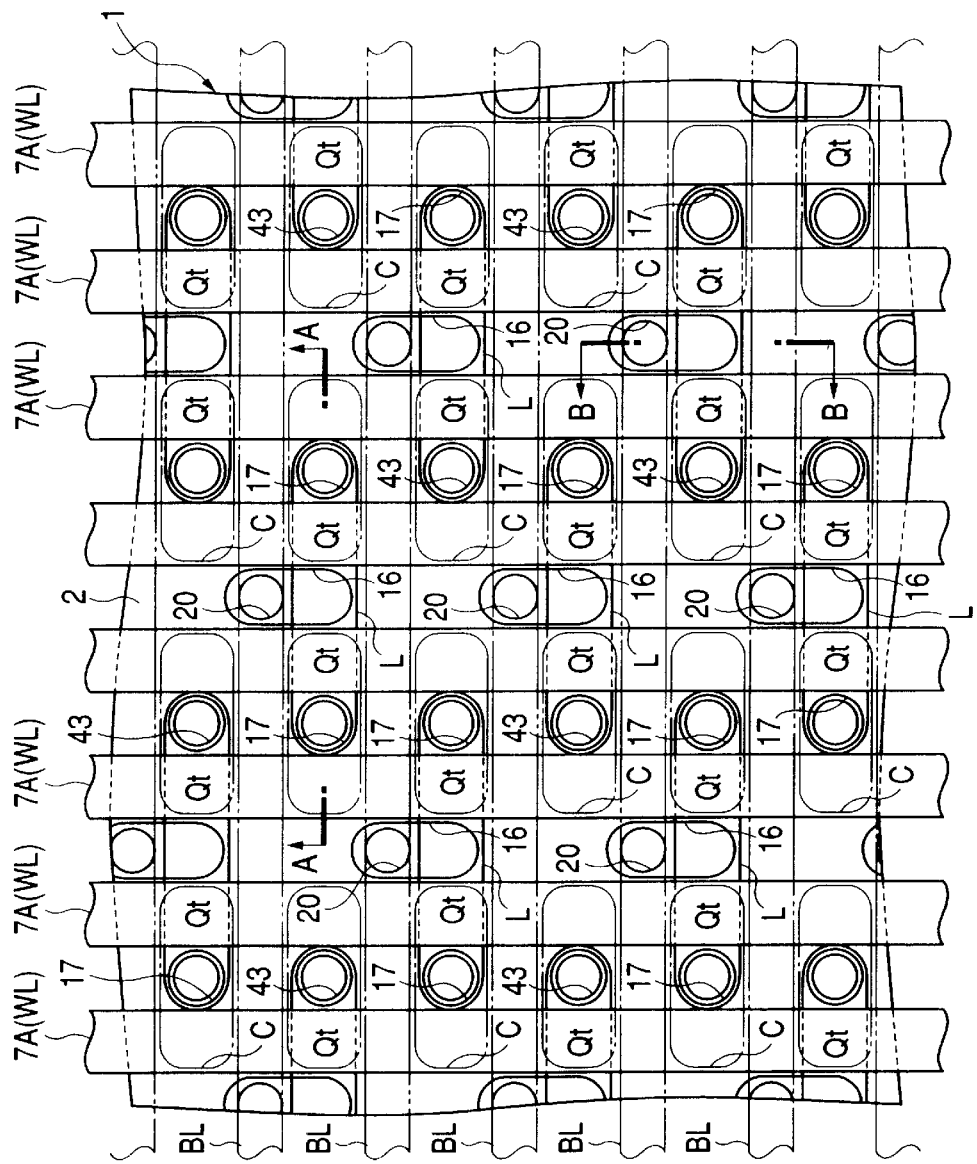
FIG. 2 is a plan view of a semiconductor substrate that shows part of the storage section of the DRAM which is one embodiment of this invention.
Figure 3:
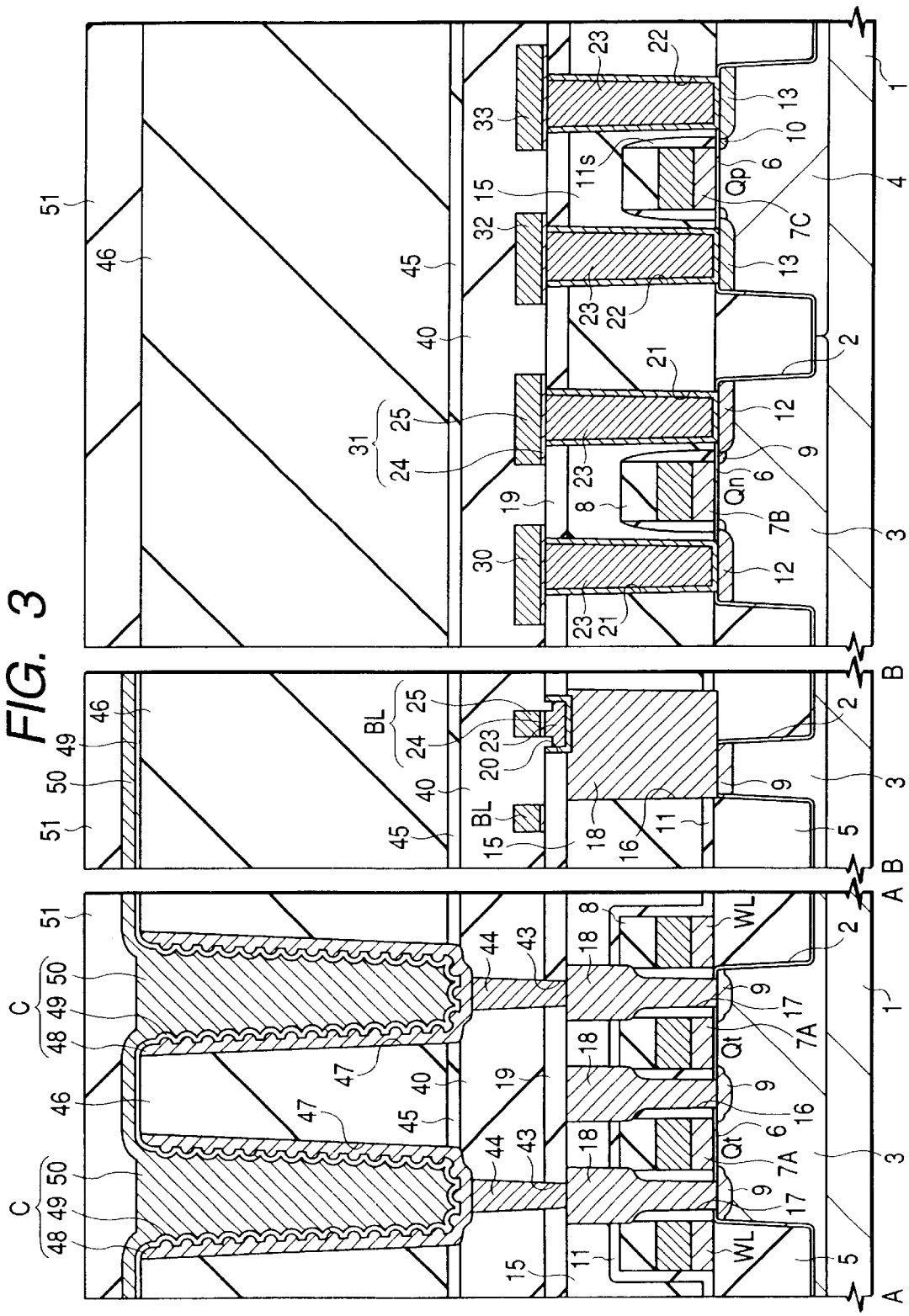
FIG. 3 is a cross-sectional view through the key parts of the semiconductor substrate that shows the DRAM which is one embodiment of this invention.

FIG. 2, which is a plan view of a semiconductor substrate, shows part of the storage section of the above DRAM, and FIG. 3 is a cross-sectional view through the key parts of the semiconductor substrate of the above DRAM. The left-hand area of FIG. 3 shows the cross-sectional view along the A—A line of FIG. 2, the central area shows the cross-sectional view along the B—B line of FIG. 2, and the right-hand area is a cross-sectional view that shows part of the peripheral circuits.

For example, element-isolation groove 2, p-type well 3, and n-type well 4 are formed over the major surface of semiconductor substrate (hereinafter referred to as simply substrate) 1 made of p-type single-crystalline silicon. Memory cells, each of which is made up of n-channel memory-cell-selecting MISFET Qt and a data-storage capacitor C formed over that, are formed over the p-type well of the storage section.

Referring to FIG. 2, element-isolation groove 2 and active regions L, which are isolated by element-isolation groove 2, are formed in p-type well 3 in the storage section. These active regions L are formed as long, narrow island patterns, and two memory-cell-selecting MISFETs Qt are formed in each active region L. These two MISFETs Qt use either a common source or a common drain. Element-isolation groove 2 that encloses active region L is formed by embedding silicon oxide film 5 in a shallow groove that is formed by etching substrate 1. The surface of silicon oxide film 5 is flattened so that its height is almost the same as that of active region L.

Memory-cell-selecting MISFET Qt is made up mainly of gate-insulating film 6, gate electrode 7A that forms word line WL in the regions outside those used for active region L, and paired n-type semiconductor regions (source and drain) 9 and 9. Gate electrode 7A (word line WL) is made of a so-called polycide film in which a W (tungsten) silicide film is deposited over an n-type polysilicon film which has been doped with, for example, phosphorus (P). The width (gate length) of gate electrode 7A (word line WL), and the space between pairs of adjacent gate electrodes 7A (word lines WL) is almost equal to the minimum size that is determined by the restriction placed on size by photolithographic resolution (for example 0.13 to 0.14 $\mu$m).

The peripheral circuits of the DRAM are made up of so called CMOS circuits in which multiple n-channel MISFETs Qn and multiple p-channel MISFETs Qp are combined. Each n-channel MISFET Qn is mainly made up of gate-insulating film 6, gate electrode 7B, and paired $n^+$-type semiconductor regions (source and drain) 12 and 12, and is formed in p-type well 3. Each p-channel MISFET Qp is mainly made up of gate-insulating film 6, gate electrode 7C, and paired $p^+$-type semiconductor regions (source and drain) 13 and 13, and is formed in n-type well 4. Like gate electrode 7A (word line WL) of memory-cell-selecting MISFET Qt, gate electrodes 7B and 7C are made of polycide films. The n-channel MISFET Qn and p-channel MISFET Qp are formed on the basis of a design rule that is less stringent than that used for memory-cell-selecting MISFET Qt; the width (gate length) of gate electrodes 7B and 7C and the space of the pairs of adjacent MISFETs are greater than those of the memory cell.

Silicon nitride film 8 is formed over gate electrode 7A (word line WL) of memory-cell-selecting MISFET Qt. Silicon nitride film 11 is deposited over the entire surface of the substrate (including silicon nitride 8, the sidewall of silicon nitride 8, and the sidewall of gate electrode 7A (word line WL)). As will be described later, these silicon nitride films 8 and 11 are used as etching stoppers when the contact hole is formed over the source and drain (n-type semiconductor region 9) of memory-cell-selecting MISFET Qs by a self-alignment method with regard to gate electrode 7A (word line WL).

Silicon nitride film 8 is formed over gate electrodes 7B and 7C of the MISFETs (Qn and Qp) of the peripheral circuits, and sidewall spacers 11s are formed on both sidewalls of gate electrodes 7B and 7C by etching silicon nitride film 11. As will be described later, sidewall spacers 11s are used so that both the sources and drains of the respective n-channel MIFETs Qn and p-channel MISFETs Qp are configured in an LDD (lightly doped drain) configuration.

Interlayer-insulating film 15 is formed over memory-cell-selecting MISFET Qt, n-channel MISFET Qn, and p-channel MISFET Qp. Interlayer-insulating film 15 is made of, for example, a spin-on-glass film (silicon-oxide insulating film formed by coating) and a two-layered silicon oxide film formed over that. The interlayer-insulating film is flattened so that the surface height is almost the same over the whole area of substrate 1.

Contact holes 16 and 17 are formed over paired n-type semiconductor regions 9 and 9 that form the source and drain of memory-cell-selecting MISFET Qt, by etching interlayer-insulating film 15 and underlying silicon nitride film 11. Plug 18 is made of a low-resistance n-type polysilicon film which is doped with, for example, phosphorus (P), and is embedded in contact holes 16 and 17.

Referring to FIG. 2, the diameter (both in the X direction parallel to gate electrode 7A (word line WL) and in the Y direction perpendicular to the X direction) of contact hole 17 is nearly the same as the width (in the X-direction) of active region L. By contrast, the diameter (in the X-direction) of the other contact hole 16 (the contact hole over n-type semiconductor region 9 that is a common region for two memory-cell-selecting MISFETs Qt) can be longer than the width (in the X-direction) of active region L. Specifically, contact hole 16 is formed as an approximately rectangular pattern which is wider in the X-direction than it is long in the Y-direction. Part of contact hole 16 extends up to the upper region of element-isolation groove 2, which is outside active region L. By designing contact hole 16 according to the above pattern, bit line BL need not be extended to the upper region of active region L by widening part of bit line BL, or part of active region L need not be extended in the direction of bit line BL, when n-type semiconductor region 9 and bit line BL are electrically connected via contact hole 16. Consequently, it is possible to reduce the memory size.

Silicon oxide film 19 is formed over interlayer-insulating film 15, then through hole 20 is formed in silicon oxide film 19 within the region of contact hole 16. Through hole 20 is designed to be located over element-isolation groove 2 that is situated outside of active region L. Plug 23, made of a two-layered conductive film over which a W film is deposited, for example a TiN (titanium nitride) film, is embedded in through hole 20. Plug 23 embedded in through hole 20 is electrically connected to either the source or drain (n-type semiconductor region 9 that is used in common by two memory-cell-selecting MISFETs Qt) of memory-cell-selecting MISFET Qt, with the interposition of plug 18 embedded in contact hole 16 under plug 23.

Contact holes 21 and 22 are formed in silicon oxide film 19 and underlying interlayer-insulating film 15 for the peripheral circuits. Contact hole 21 is formed over paired $n^+$-type semiconductor regions (source and drain) 12 and 12 that form the source and drain of n-channel MISFET Qn. Contact hole 22 is formed over paired $p^+$-type semiconductor regions (source and drain) 13 and 13 that form the source and drain of p-channel MISFET Qp. Plug 23, made of the same conductive material as plug 23 that was earlier embedded in through hole 20 of said storage section, is embedded in contact holes 21 and 22.

Bit lines BL, for reading the data from the memory cells, are formed over silicon oxide film 19 of the storage section. These bit lines BL, provided over element-isolation groove 2, extend with a uniform line width and spacing between lines in the direction perpendicular to gate electrode 7A (word line WL). Each bit line BL is electrically connected, via plug 23 in said through hole 20 in silicon oxide film 19 under the bit lines and via plug 18 in contact hole 16 under silicon oxide film 19, to either the source or drain (n-type semiconductor region 9) of each memory-cell-selecting MISFET Qt that runs parallel to bit lines BL.

Bit lines BL should be as narrow as possible so that spacing is sufficient to ensure a margin against short-circuit with plug 44 that has been embedded in through hole 43 formed in the space between the adjacent bit lines. The parasitic capacitance between adjacent bit lines is thus also reduced. For the DRAM of this embodiment, the width of bit line BL is 0.1 μm or narrower. This is narrower than the width (0.13 to 0.14 μm) of gate electrode 7A (word line WL) as described above and the space (0.13 to 0.14 μm) between pairs of adjacent gate electrodes 7A (word lines WL). That is, a narrower bit line BL is formed than the minimum size as determined by the limitations on photolithographic resolution. The method for forming such fine bit lines BL will be described later.

As a countermeasure against wiring-break failures in bit lines BL that are as narrow as 0.1 μm or narrower, bit line BL of the DRAM of this embodiment is made of a two-layered conductive film in which W film 25 is deposited on WN (tungsten nitride) film 24. The following paragraphs explain, on the basis of the results of investigations by the inventors, how wiring failures can be avoided using said two-layered conductive film to form, over silicon oxide film 19, a 0.1 μm-or-narrower bit line BL.

In general, when a w film is deposited on a given foundation film, the W atoms will not be in an orderly alignment if there is a large difference between the lattice constants of the foundation material and W. As a result, segregations appear at the interface, and surface diffusion of W atoms is liable to occur because W atoms move along the segregations that are generated at the interface with the foundation film. Therefore, the surface diffusion distance of W atoms increases with the extent of the segregations on the other hand, when there is little difference between the lattice constants of the foundation material and W, it is possible for the W atoms to be in an orderly alignment. As a result, the region of segregations at the interface between the two lattices is significantly narrower, and consequently, the surface diffusion distance of W atoms is shortened.

Vacancies and dislocations inside crystal grains contribute to the diffusion paths for atoms, so atoms are more likely to travel within grains if the grains contain many vacancies or dislocations. Accordingly, when a film is formed under conditions that readily bring the arrangement of the W atoms into disorder, the number of W atoms at the grain boundaries decreases, since many of the W atoms tend to diffuse to fill up the vacancies and dislocations. This is the case when the difference between the lattice constants of the foundation material and W is great and the W film is then subjected to high-temperature thermal processing.

There is a large difference between the lattice constants of silicon oxide and W. Accordingly, when W film 25 is directly deposited on silicon oxide film 19, large segregations grow at the interface between the two films, and many vacancies and dislocations are generated within the crystal grains of W film 25. The inventors have found that there is a tensile stress inside W film 25 after a bit line has been formed by patterning W film 25 which has been directly deposited on silicon oxide film 19.

In the DRAM fabrication process, when a thermal processing at a temperature higher than the temperature at which W film 25 is formed is carried out after the bit lines have been formed, many W atoms are diffused across the interface between W film 25 that forms the bit lines and silicon oxide film 19 formed under that, within the crystal grains, and at the grain boundary of W film 25, and the number of W atoms at the grain boundaries is thus decreased. As a result, segregations appear at the grain boundaries because of the tensile stress generated inside W film 25. In this case, when the bit line is sufficiently wider than the grain size of W film 25, wiring breaks do not occur immediately. However, when the wiring width is narrowed to approximately 0.1 μm, which is equal to the average grain size of W film 25, wiring breaks occur.

By contrast, there is only a small difference between the lattice constants of WN and W. Accordingly, when W film 25 is deposited on WN film 24, W atoms are in an orderly arrangement that accords with the arrangement of the WN atoms. In such cases, the segregations at the interface are significantly narrower, and a tightly-packed and finely-grained film, with few vacancies or dislocations inside its crystal grains, can thus be obtained. In addition, the inventors have found that a compressive stress is generated inside W film 25 even when bit line BL is formed by the patterning of a two-layered conductive film in which W film 25.is deposited on WN film 24.

As described thus far, in bit line BL that is made of a two-layered conductive film in which W film 25 is deposited on WN film 24, few W atoms are diffused across the interface between W film 25 and WN film 24 under that, within crystal grains and at the grain boundaries of W film 25. In addition, no tensile stress is generated inside W film 25. Therefore, wiring breaks are not caused by high-temperature processing even when the wiring width is narrowed to 0.1 µm or less.

Materials with lattice constants that are close to that of W include Mo (molybdenum) and its compounds, such as MoN (molybdenum nitride), MoB (molybdenum boride), and MoC (molybdenum carbide), as well as WN. By forming bit lines BL of two-layered conductive films in which a W film is deposited on an Mo film or Mo-compound film, wiring breaks can be prevented even when the width of bit line BL is narrowed to 0.1 µm or less. TiN is also used as a barrier material, though the difference between its lattice constant and that of W is greater than the differences for WN, Mo, and its compounds. However, a W film has compressive stress when it is deposited on a TiN film. Therefore, by forming bit lines BL of two-layered conductive films in which a W film is deposited on a TiN film, the wiring-break rate can be reduced even when the width of bit line BL is narrowed to 0.1 µm or less.

As shown in FIG. 3, first-layer wires 30 to 33 are formed over silicon oxide film 19 in the peripheral circuits. wires 30 to 33 are made of two-layered conductive films in which W film 25 is deposited on WN film 24, in a similar way to and at the same time as bit lines BL as is described later. Wires 30 and 31 are electrically connected to the source and drain of n-channel MISFET Qn (n$^+$-type semiconductor region 12) through contact holes 21 that have been formed in silicon oxide films 19 and 15. Wires 32 and 33 are electrically connected to the source and drain of p-channel MISFET Qp (p$^+$-type semiconductor region 13) through contact holes 22 that have been formed in silicon oxide films 19 and 15.

Interlayer-insulating film 40 is formed over bit line BL and first-layer wires 30 to 33. Interlayer-insulating film 40 is made of a spin-on-glass film and a two-layered silicon oxide film which is formed over the spin-on-glass film, in a similar way to the formation of lower interlayer-insulating film 15. Film 40 is flattened so that the surface height is almost the same over the whole area of substrate 1.

In the storage section, through holes 43 are formed in interlayer-insulating film 40 and silicon oxide film 19 under interlayer-insulating film 40. Through-holes 43 are located directly above contact holes 17, and plugs 44 that are made of low-resistance n-type polysilicon films which have been doped with P (phosphorus) are embedded in through-holes 43.

Silicon nitride film 45 and thick silicon oxide film 46 are formed over interlayer-insulating film 40. In the storage section, deep grooves 47 are formed in silicon oxide film 46. Data-storage capacitors C, which are configured by lower electrode 48, capacitance-insulating film 49, and upper electrode 50, are formed in deep grooves 47. Lower electrodes 48 of data-storage capacitors C are made of a low-resistance n-type polysilicon film which has been doped with P (phosphorus). Lower electrodes 48 are electrically connected to n-type semiconductor regions (source and drain) 9 of memory-cell-selecting MISFETs Qn via through hole 43 and contact hole 17 that have been formed under lower electrode 48. Capacitance-insulating film 49 of data-storage capacitor C is a Ta$_2$O$_5$ (tantalum pentoxide) film, etc. Upper electrode 50 is made of a TiN film, etc.

Silicon oxide film 51 is then formed over data-storage capacitor C, and two or so layers of Al are formed as wiring (not shown) over silicon oxide film 51.

FIGS. 4 to 27 will be referred to in describing an example of a method of fabricating a DRAM that is related to the embodiment as configured above.

Figure 4:
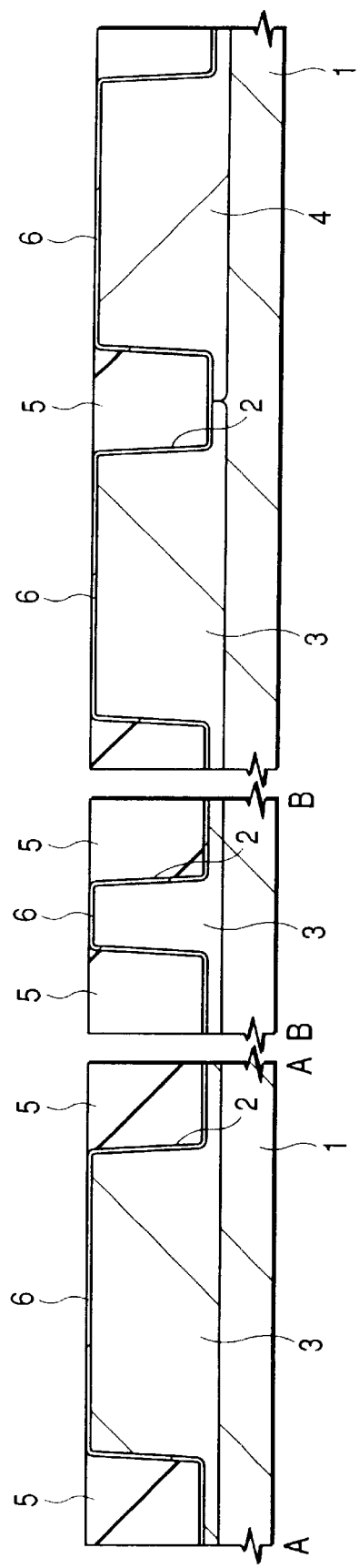
FIG. 4 is a cross-sectional view through the key parts of the semiconductor substrate that shows the method of fabricating the DRAM which is one embodiment of this invention.
Figure 5:
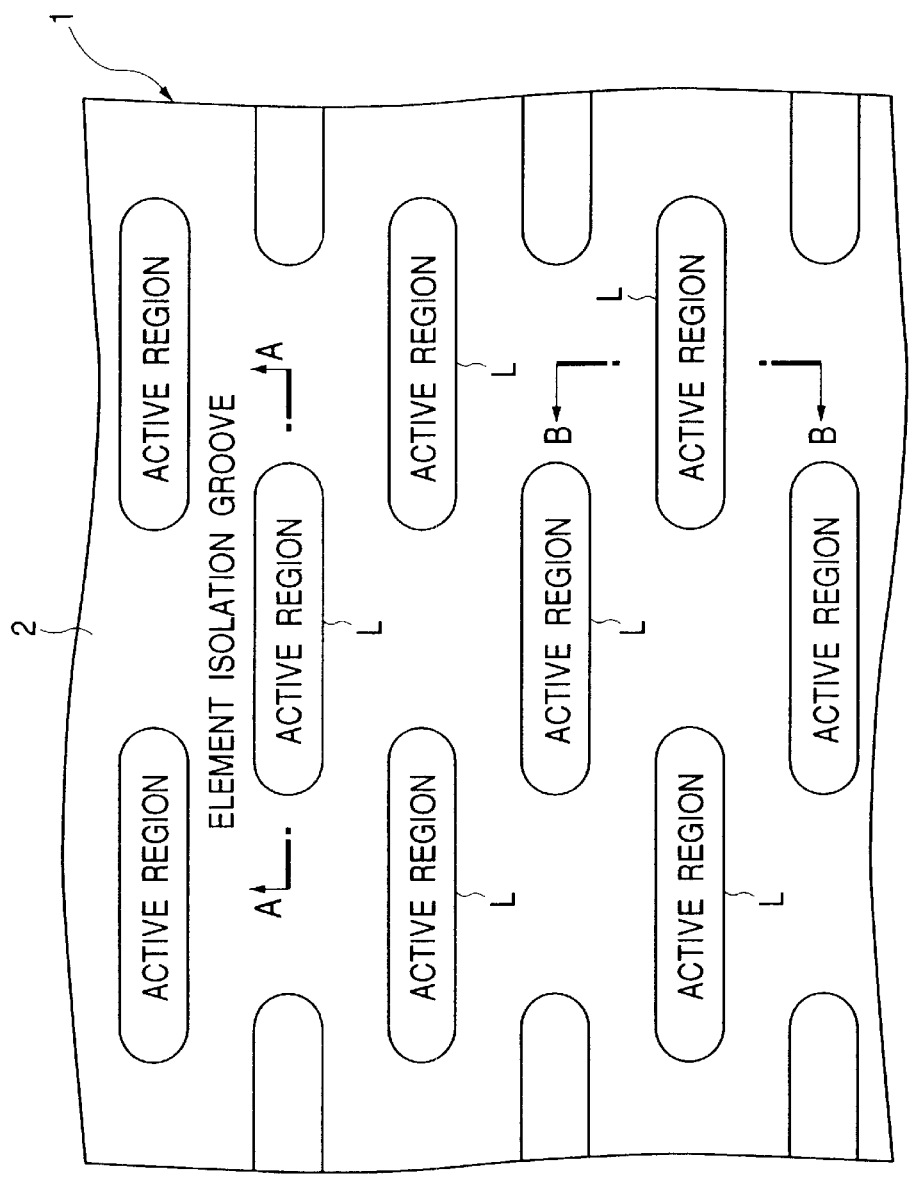
FIG. 5 is a plan view of the semiconductor substrate that shows the method of fabricating the DRAM which is one embodiment of this invention.

As shown in FIG. 4, the element-isolation region of substrate 1 is etched to form element-isolation groove 2 with a depth of about 350 nm on the major surface of p-type single-crystalline silicon substrate 1. B (boron) ions are then implanted into parts of substrate 1 to form p-type wells 3 and P (phosphorus) ions are implanted into other parts of substrate 1 to form n-type wells 4. Silicon oxide film 5 is then deposited by chemical vapor deposition (CVD) in the grooves and over substrate 1, and the superfluous part of silicon oxide film 5 that protrudes beyond the groove is removed by chemical mechanical polishing (CMP). As shown in FIG. 5, active regions L, which are the long, narrow island patterns that are surrounded by element-isolation grooves 2, are formed in substrate 1 in the storage section by the formation of element-isolation grooves 2.

Figure 6:
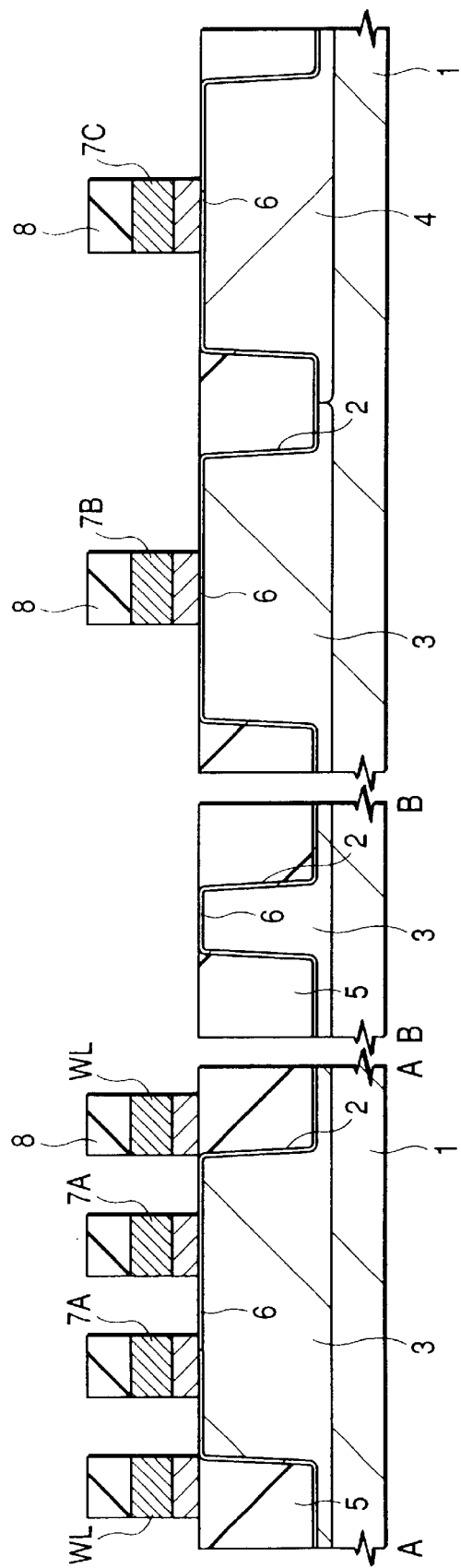
FIG. 6 is a cross-sectional view through the key parts of the semiconductor substrate that shows the method of fabricating the DRAM which is one embodiment of this invention.
Figure 7:
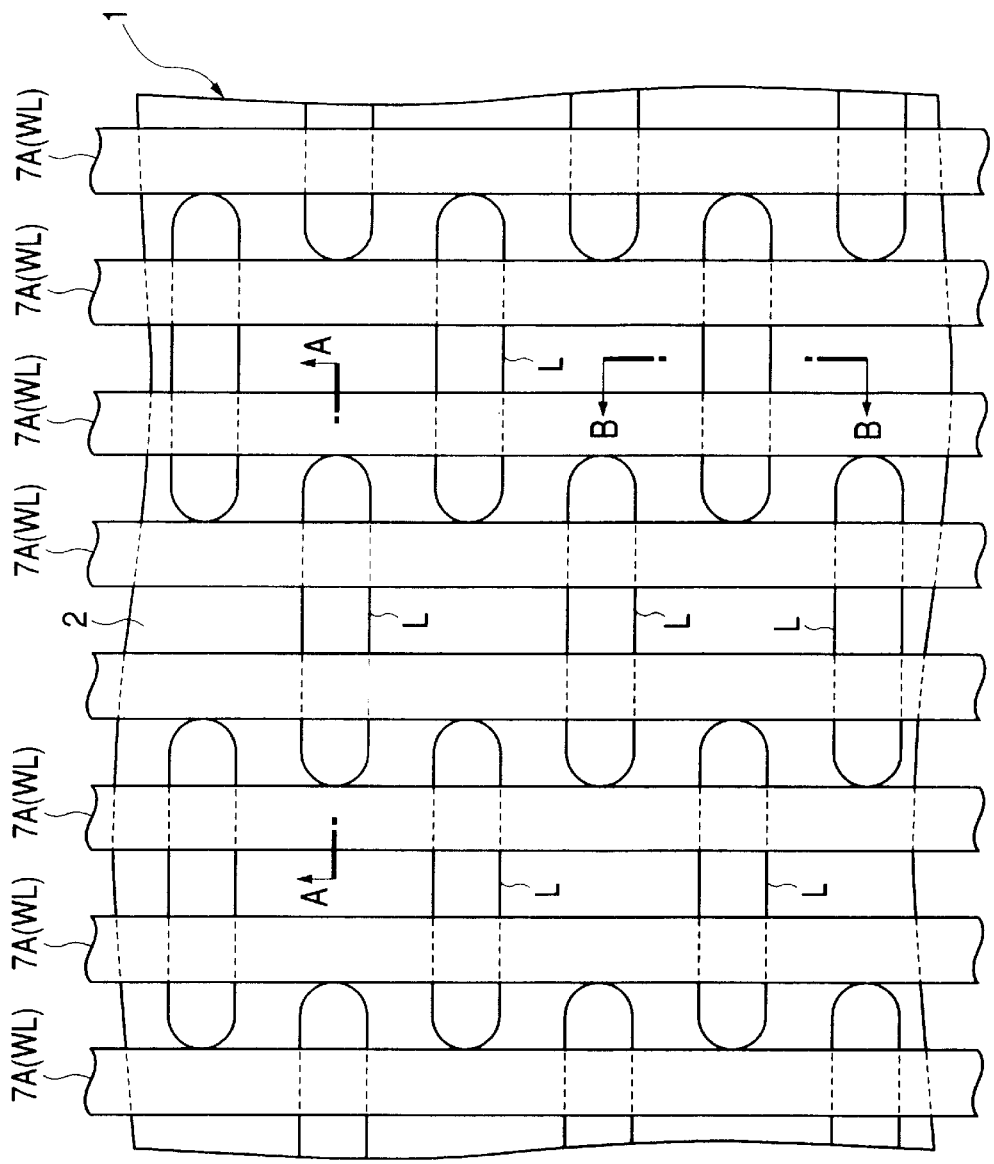
FIG. 7 is a plan view of the semiconductor substrate that shows the method of fabricating the DRAM which is one embodiment of this invention.

Gate-insulating film 6 is formed of silicon oxide over type well 3 and n-type well 4 by the thermal oxidation of substrate 1. As shown in FIGS. 6 and 7, gate electrodes 7A (word lines WL) are then formed over gate-insulating film 6 in the storage section, and gate electrodes 7B and 7C are formed over gate-insulating film 6 in the peripheral circuits. A polysilicon film which has been doped with P (phosphorus) is deposited over substrate 1 by CVD to form gate electrodes 7A, 7B, and 7C. A W silicide film is then sputtered over the polysilicon film, and silicon nitride film 8 is deposited over the W silicide film by CVD. Silicon nitride film 8 is patterned by using a photoresist film as a mask against dry etching, and the W silicide film and polysilicon film are then patterned by using silicon nitride film 8 as a mask against dry etching. As shown in FIG. 7, gate electrodes 7A (word lines WL) run perpendicularly across the longer sides of active regions L, and the gate length and the space between adjacent gate electrodes 7A (word lines WL) are both in the 0.13 to 1.4 µm range.

As shown in FIG. 8, As (arsenic) ions are implanted in p-type well 3 on both sides of gate electrodes 7A and 7B to form n$^-$-type semiconductor regions 9 in p-type well 3. In addition, B (boron) ions are implanted in n-type well 4 on both sides of gate electrode 7C to form p$^-$-type semiconductor regions 10 in n-type well 4.

Silicon nitride film 11 is deposited over substrate 1 by CVD. As shown in FIG. 9, the storage sections of substrate 1 are then covered by a photoresist film (not shown), and silicon nitride film 11 in the peripheral circuits is anisotropically etched. As a result, side-wall spacers 11s are formed on both sidewalls of gate electrodes 7B and 7C in the peripheral circuits.

In the peripheral circuits, P ions are implanted into P-type well 3 to form n$^+$-type semiconductor regions (source and drain) 12 with a high concentration of impurities, and B ions are implanted into n-type well 4 to form p+-type semiconductor regions (source and drain) 13 with a high concentration of impurities. The above processes complete the formation of n-channel MISFET Qn and p-channel MISFET Qp in the peripheral circuits.

Figure 10:
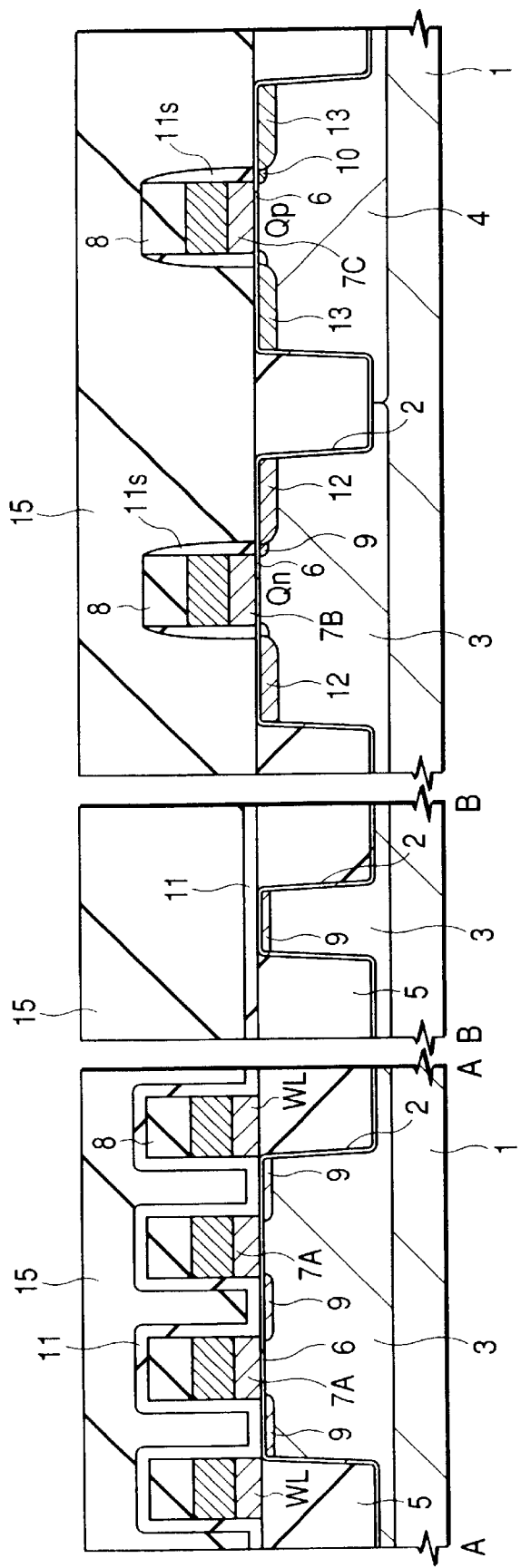
FIG. 10 is a cross-sectional view through the key parts of the semiconductor substrate that shows the method of fabricating the DRAM which is one embodiment of this invention.

As shown in FIG. 10, interlayer-insulating film 15 made of a spin-on-glass film and a two-layered silicon oxide film is formed over gate electrodes 7A, 7B, and 7C. Interlayer-insulating film 15 is formed by spin-coating a spin-on-glass film over gate electrodes 7A, 7B, and 7C. The spin-on-glass film has superior characteristics in terms of filling spaces between fine wires to those of a silicon oxide film deposited by CVD. Therefore, even if the spaces between gate electrodes 7A (word lines WL) of the storage section are extremely narrow, the space can be filled perfectly by using the spin-on-glass film. After a silicon oxide film is deposited by CVD over the spin-on-glass film, the silicon oxide film is polished and flattened by CMP to make the heights of the storage section and peripheral circuits uniform. The second silicon oxide film is then deposited by CVD over the first silicon oxide film to cover the fine scratches on the surface of the lower (first) silicon oxide film that are caused by CMP.

Figure 11:
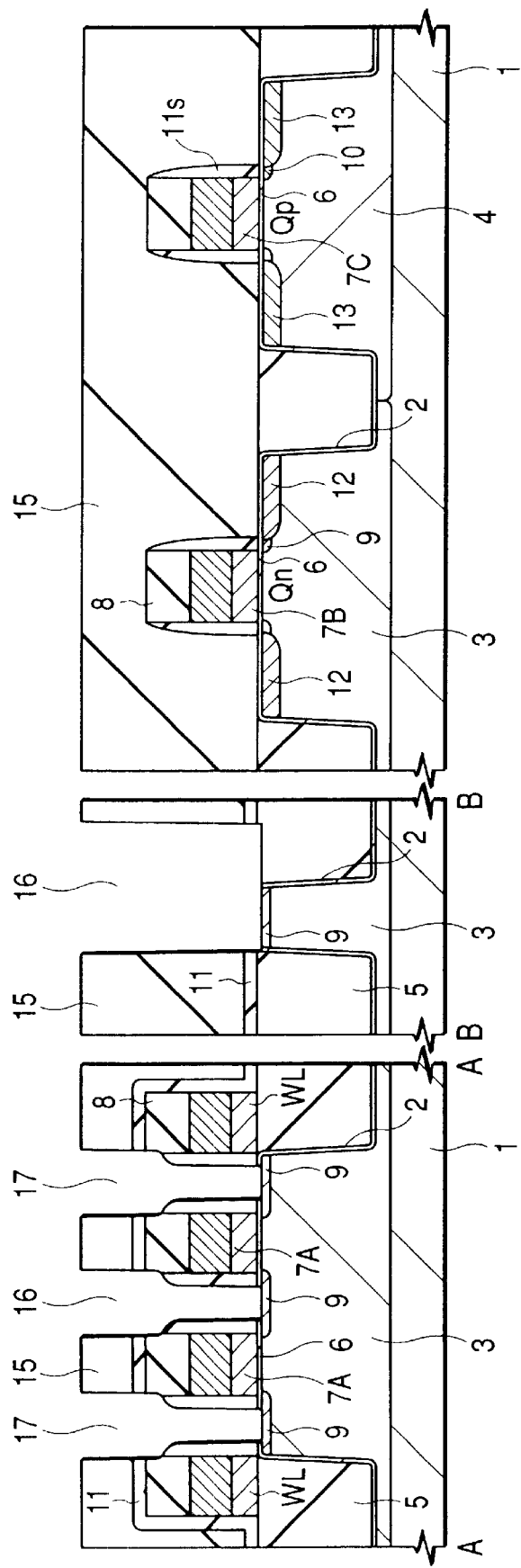
FIG. 11 is a cross-sectional view through the key parts of the semiconductor substrate that shows the method of fabricating the DRAM which is one embodiment of this invention.
Figure 12:
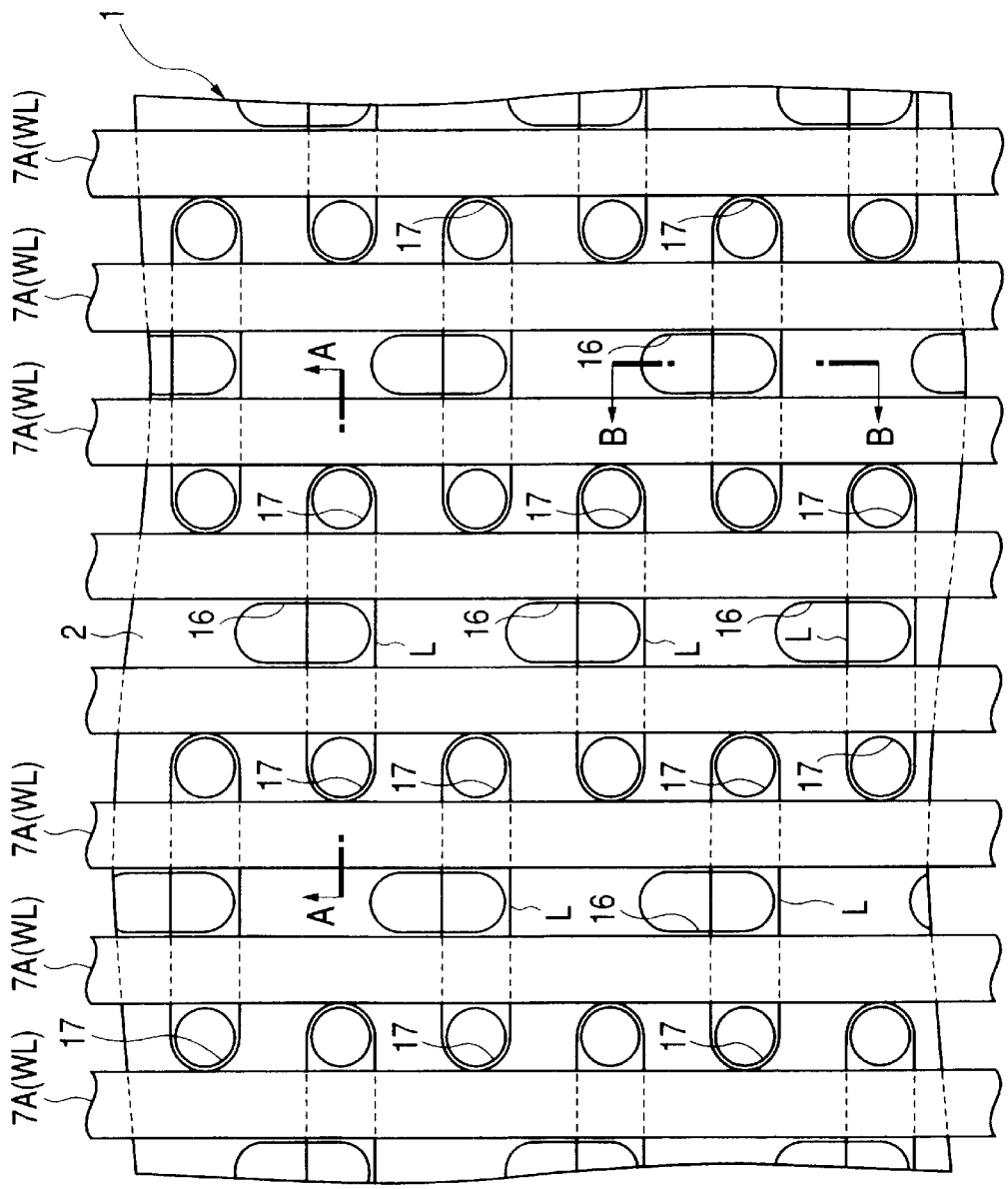
FIG. 12 is a plan view of the semiconductor substrate that shows the method of fabricating the DRAM which is one embodiment of this invention.

As shown in FIGS. 11 and 12, interlayer-insulating films 15 over n⁻-type semiconductor regions 9 in the storage section are removed by dry etching. A photoresist film (not shown) is used as a mask. The condition for this etching is that the rate of etching of interlayer-insulating films 15 (the spin-on-glass film and silicon oxide film) must be greater than that of silicon nitride films 8 and 11.

Silicon nitride film 11 is removed from n⁻-type semiconductor regions 9 by dry etching, using a photoresist film as a mask, and the surface of n⁻-type semiconductor regions 9 is then exposed so that contact holes 16 and 17 are thus formed. The condition for the etching of silicon nitride film 11 is that the etching rate of silicon nitride film 11 is greater than that of silicon oxide film 5 embedded in element-isolation groove 2. This is so that silicon oxide film 5 in element-isolation groove 2 is not etched deeply. Silicon nitride film 11 is anisotropically etched and silicon nitride film 11 thus remains on both sidewalls of gate electrodes 7A (word lines WL). Therefore, contact holes 16 and 17 are formed with fine diameters by a self-alignment method with regard to gate electrodes 7A (word lines WL). As earlier described, part of long-patterned contact hole 16 extends up to the upper region of element-isolation groove 2, which is outside active region L.

Figure 13:
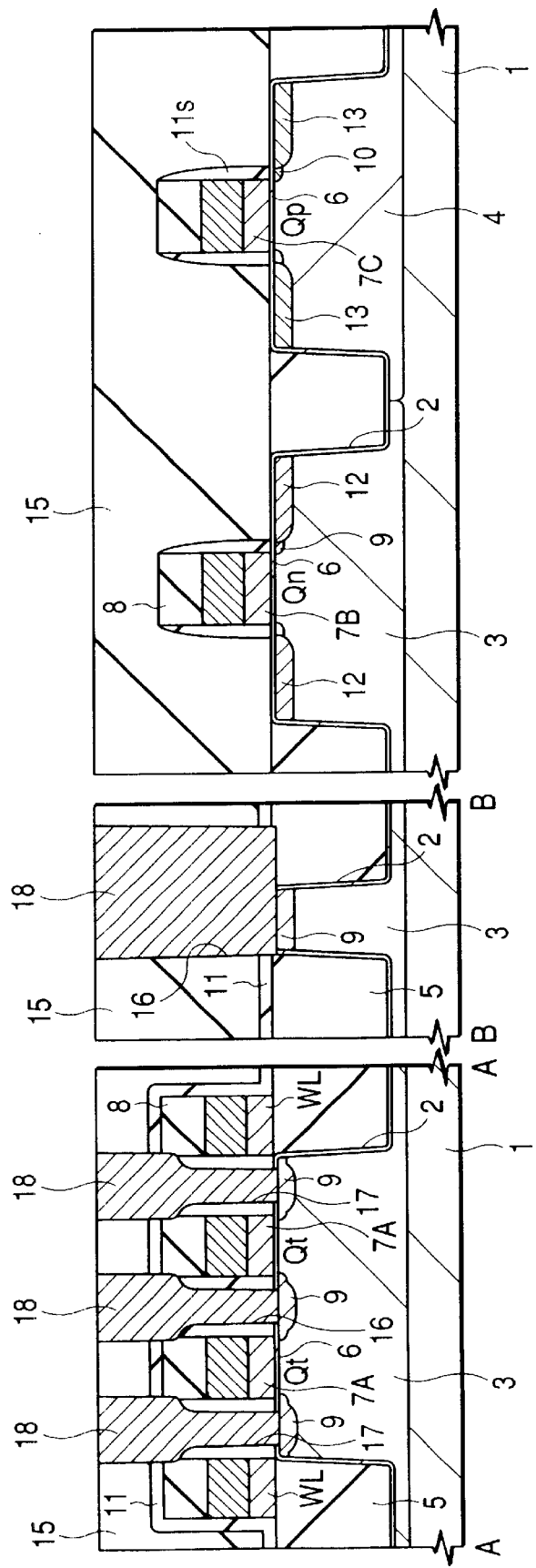
FIG. 13 is a cross-sectional view through the key parts of the semiconductor substrate that shows the method of fabricating the DRAM which is one embodiment of this invention.

As shown in FIG. 13, plugs 18 are formed in contact holes 16 and 17. To form plugs 18, a low-resistance polysilicon film which has been doped with P is deposited by CVD in contact holes 16 and 17 and over interlayer-insulating film 15, and the superfluous polysilicon film over interlayer-insulating film 15 is removed by dry etching.

Substrate 1 is thermal-processed in an atmosphere of nitrogen and the P in the polysilicon film which configures plug 18 is diffused into n⁻-type semiconductor regions 9 to form low-resistance n-type semiconductor regions 9 (source and drain). The above processes complete the creation of memory-cell-selecting MISFET Qt in the storage section.

Figure 14:
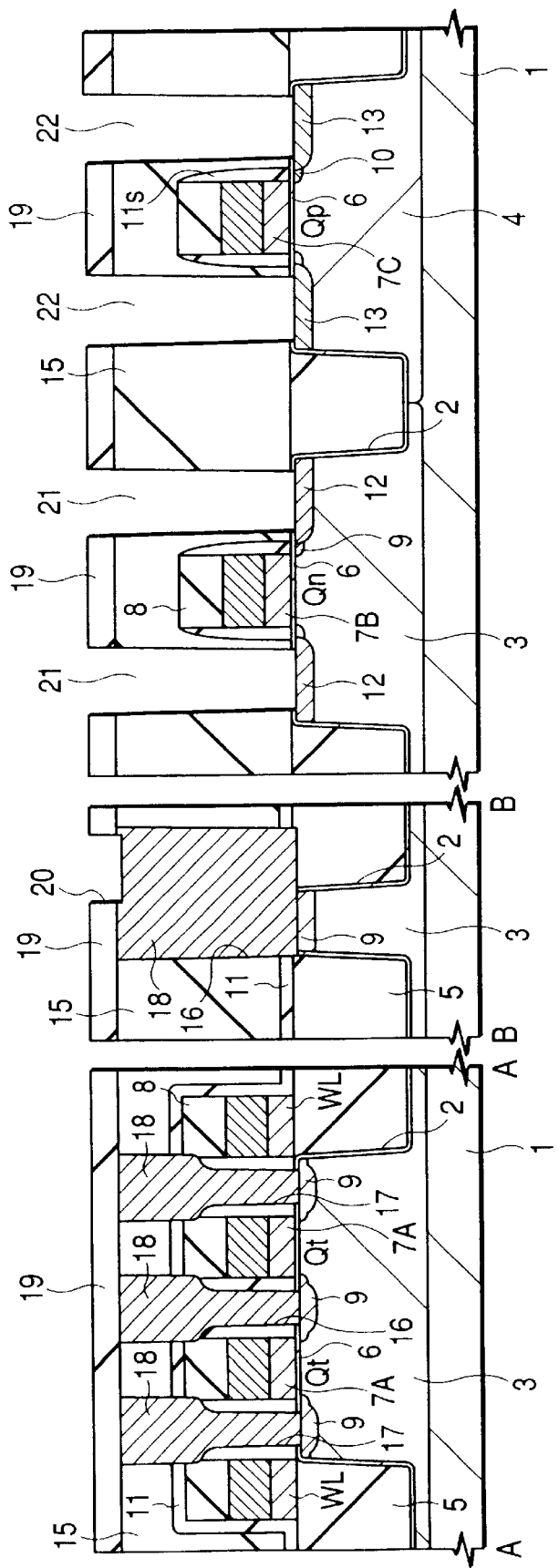
FIG. 14 is a cross-sectional view through the key parts of the semiconductor substrate that shows the method of fabricating the DRAM which is one embodiment of this invention.
Figure 15:
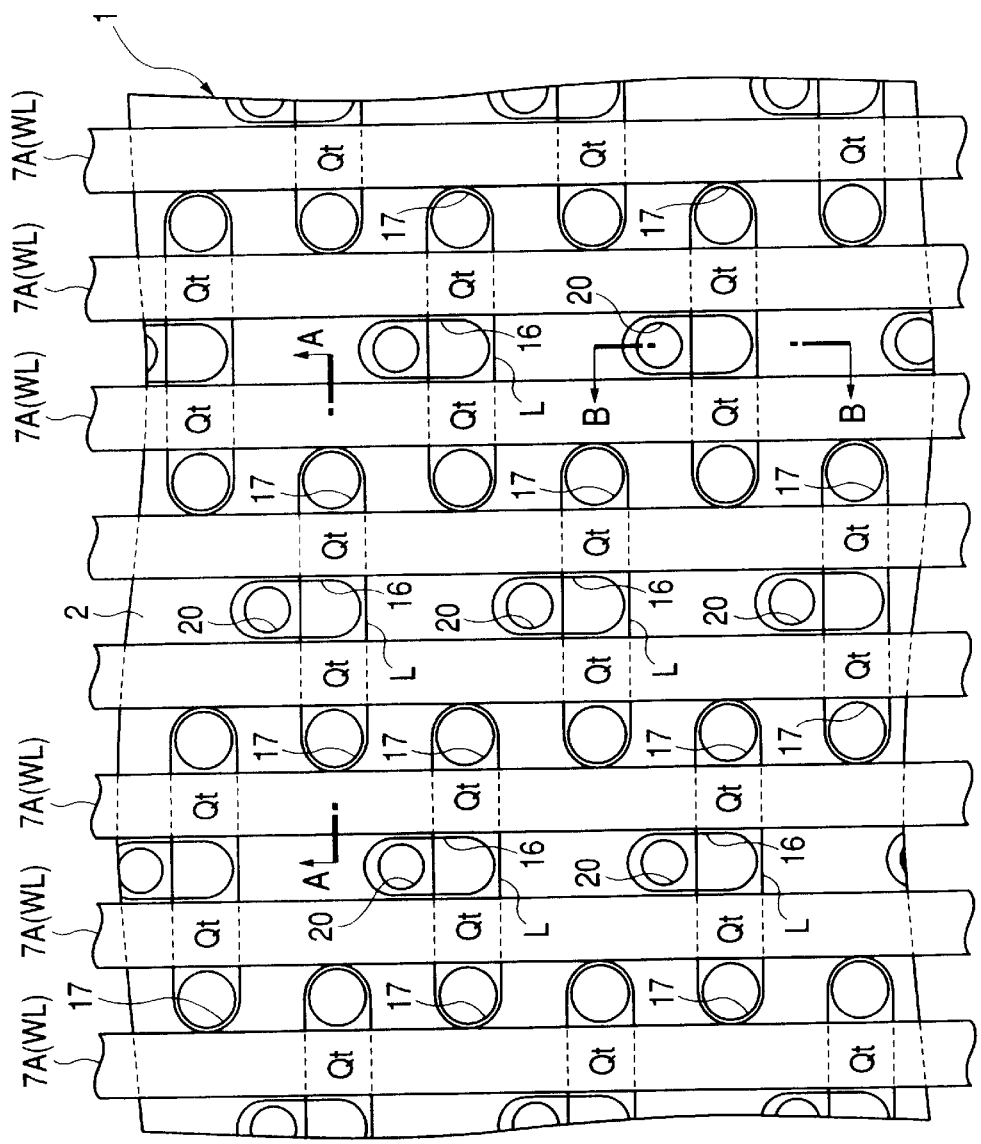
FIG. 15 is a plan view of the semiconductor substrate that shows the method of fabricating the DRAM which is one embodiment of this invention.

As shown in FIGS. 14 and 15, after silicon oxide film 19 has been deposited by CVD over interlayer-insulating film 15, a photoresist film (not shown) is used as a mask in the dry etching of silicon oxide film 19 and interlayer-insulating film 15 in the peripheral circuits. As a result, contact holes 21 are formed above the source and drain of n-channel type MISFET Qn (n+-type semiconductor region 12), and contact holes 22 are formed above the source and drain of p-channel type MISFET Qp (p+-type semiconductor region 13). At the same time, silicon oxide film 19 in the storage section is etched to form through hole 20 over contact hole 16.

Figure 16:
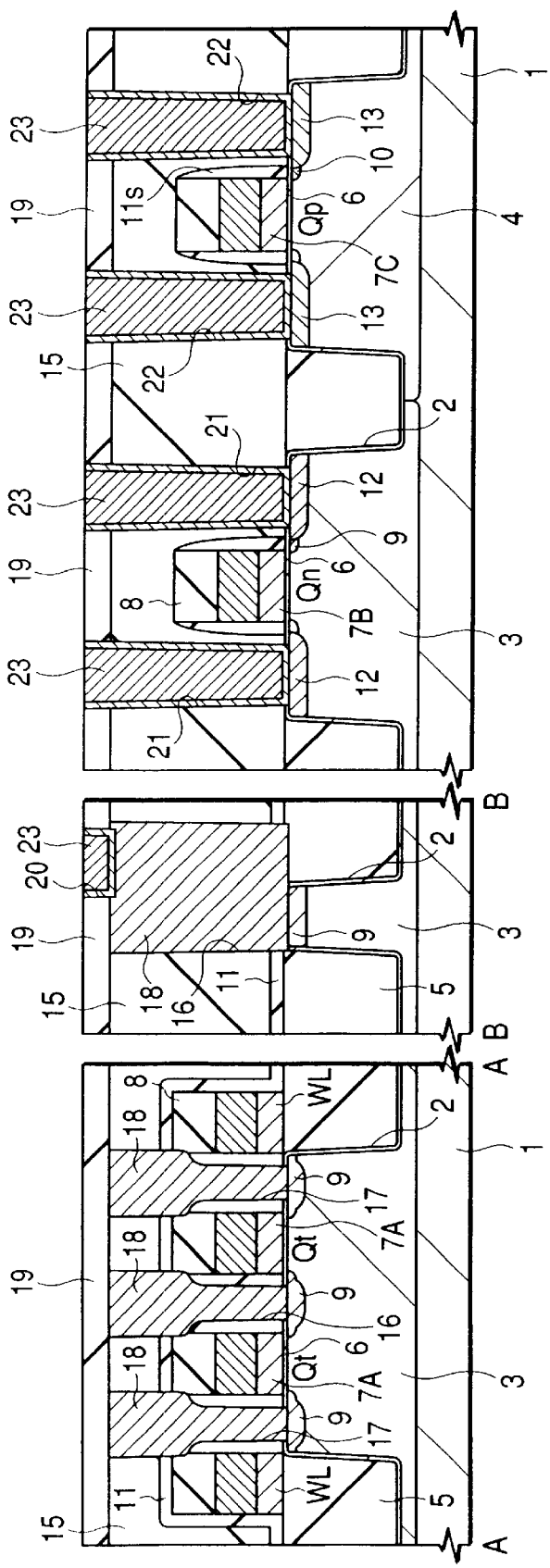
FIG. 16 is a cross-sectional view through the key parts of the semiconductor substrate that shows the method of fabricating the DRAM which is one embodiment of this invention.

As shown in FIG. 16, plugs 23 are formed in contact holes 21 and 22 that have been formed in the peripheral circuits and in through hole 20 that has been formed in the storage section. Plugs 23 are formed of TiN and W films that are deposited, by sputtering and CVD, over silicon oxide film 19, in contact holes 21 and 22, and in through hole 20. The superfluous TiN and W films over silicon oxide film 19 are then removed by CMP.

Figure 17:
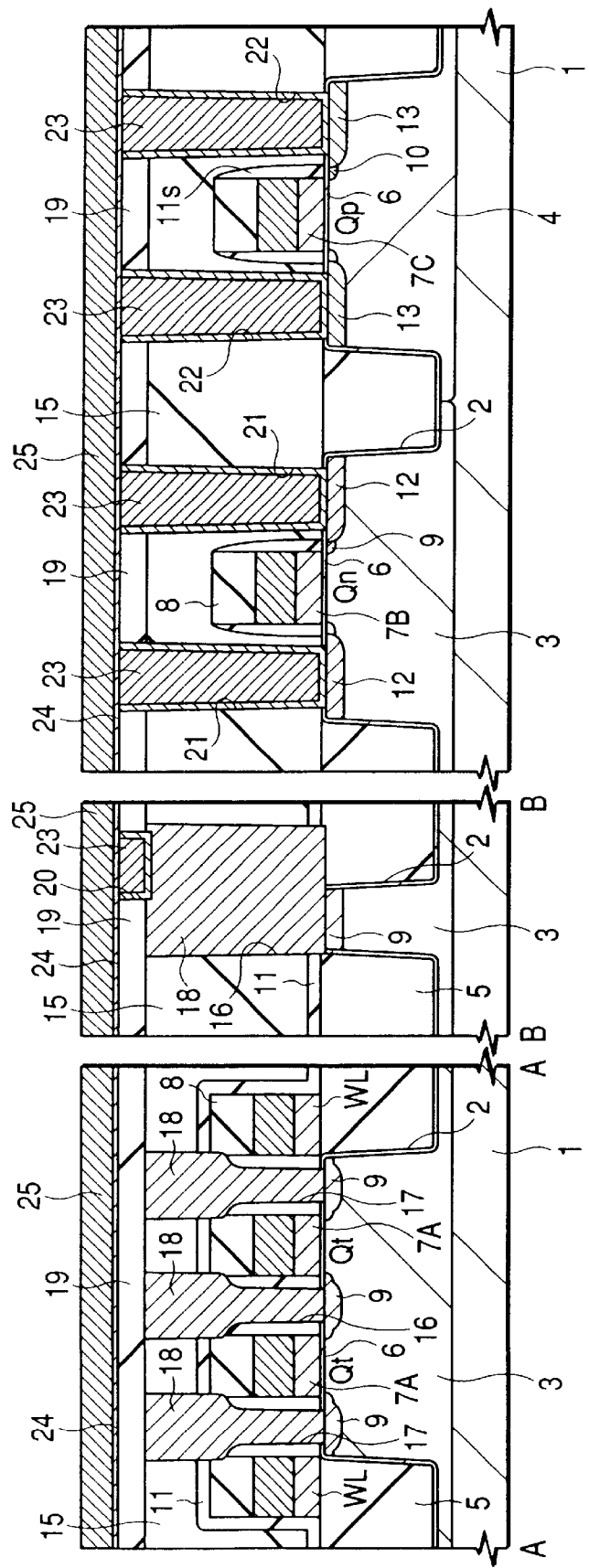
FIG. 17 is a cross-sectional view through the key parts of the semiconductor substrate that shows the method of fabricating the DRAM which is one embodiment of this invention.

As shown in FIG. 17, WN film 24 and W film 25 are deposited, by sputtering and in that order over silicon oxide film 19. As earlier described, the deposition of W film 25 on WN film 24 leads to a more tightly-packed and finely-grained W film 25 with greatly-narrow interfacial segregations and with fewer vacancies and dislocations in the crystal grains, than would be obtained by the direct deposition of W film 25 on silicon oxide film 19.

Figure 18:
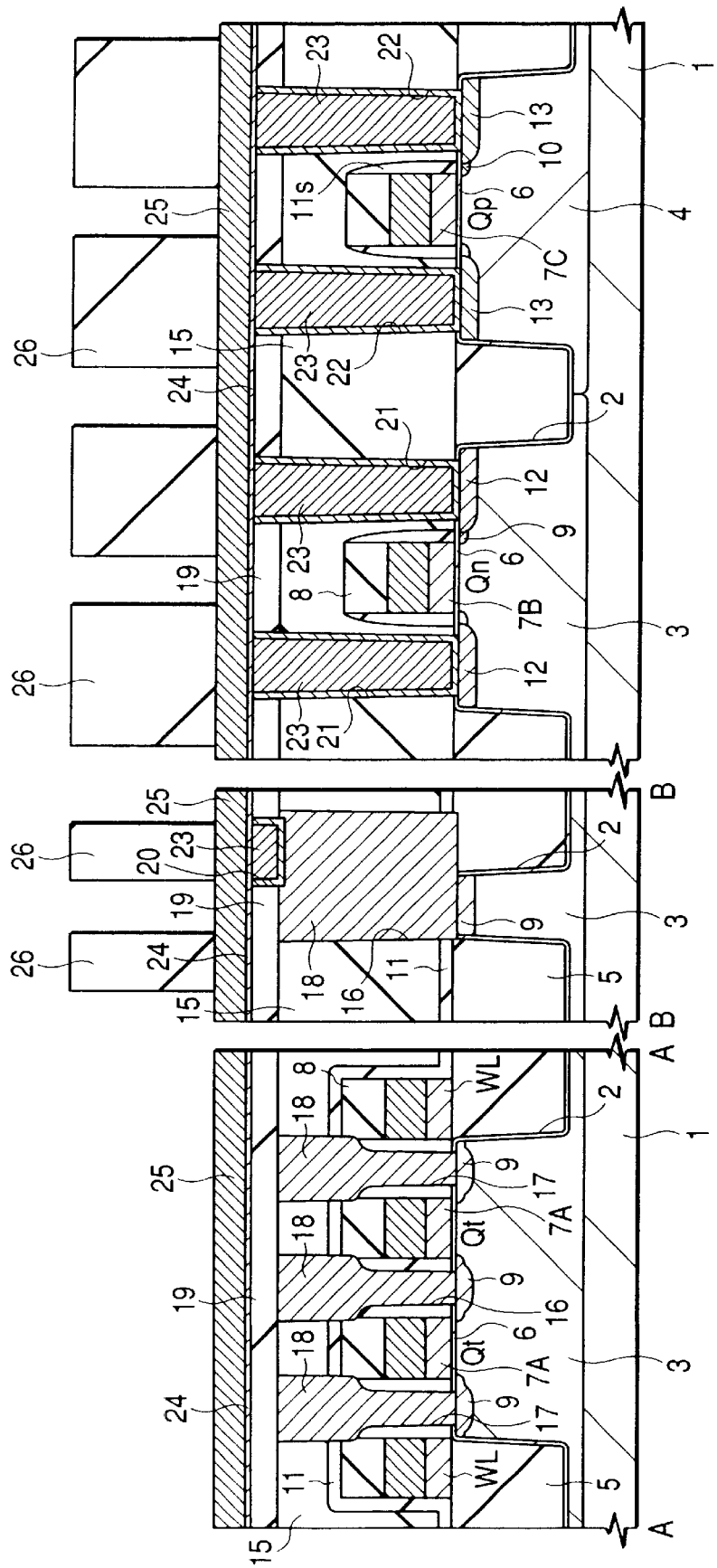
FIG. 18 is a cross-sectional view through the key parts of the semiconductor substrate that shows the method of fabricating the DRAM which is one embodiment of this invention.

As shown in FIG. 18, photoresist masks 26 are formed over W film 25. The width of photoresist mask 26 formed over W film 25 in the storage section is around 0.18 to 0.2

Figure 19:
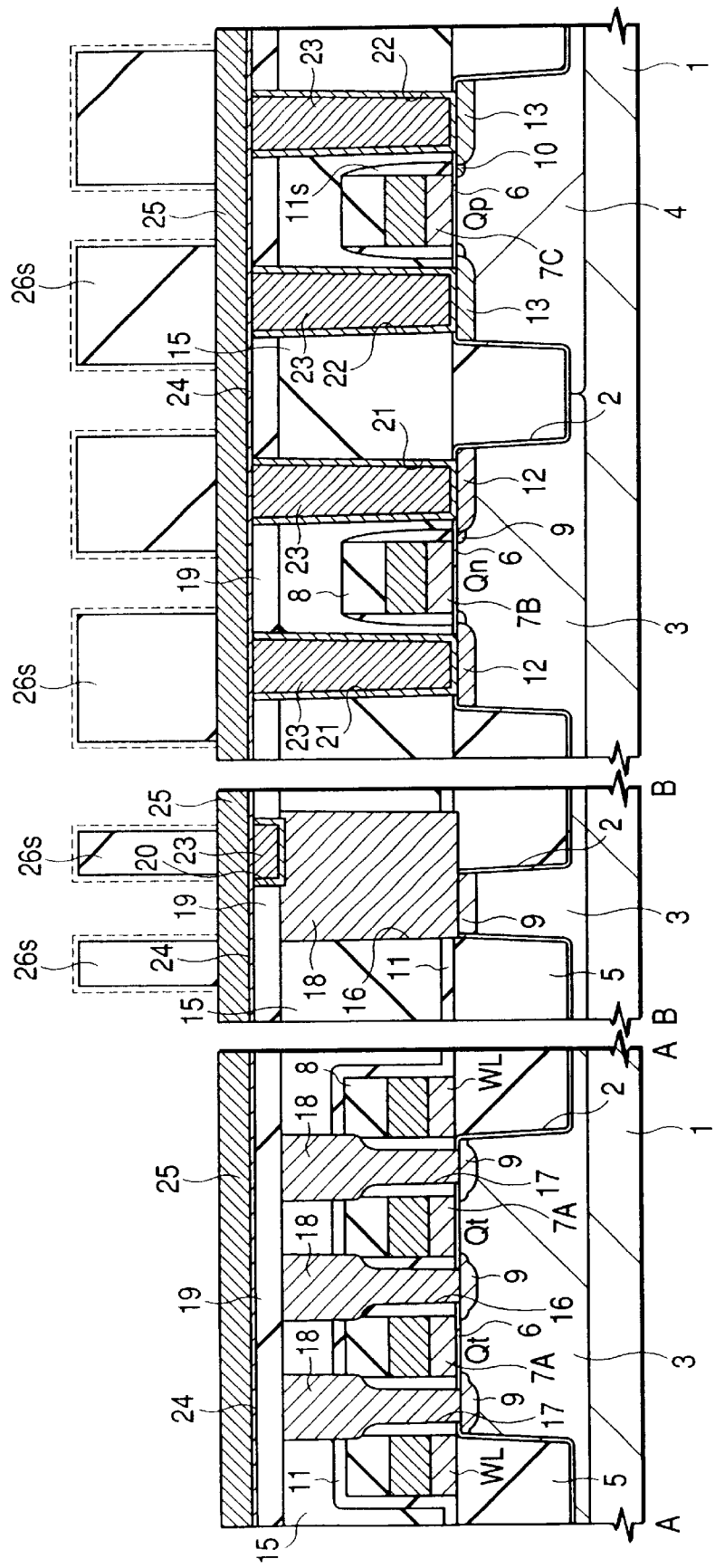
FIG. 19 is a cross-sectional view through the key parts of the semiconductor substrate that shows the method of fabricating the DRAM which is one embodiment of this invention.

As shown in FIG. 19, photoresist masks 26 are narrowed using active oxygen radicals, which can be generated by the irradiation of ozone by ultraviolet rays, in the well-known ashing process. This process narrows the line widths of photoresist masks 26s formed over W film 25 in the storage section to, for example, around 0.12 to 0.13 µm.

Figure 20:
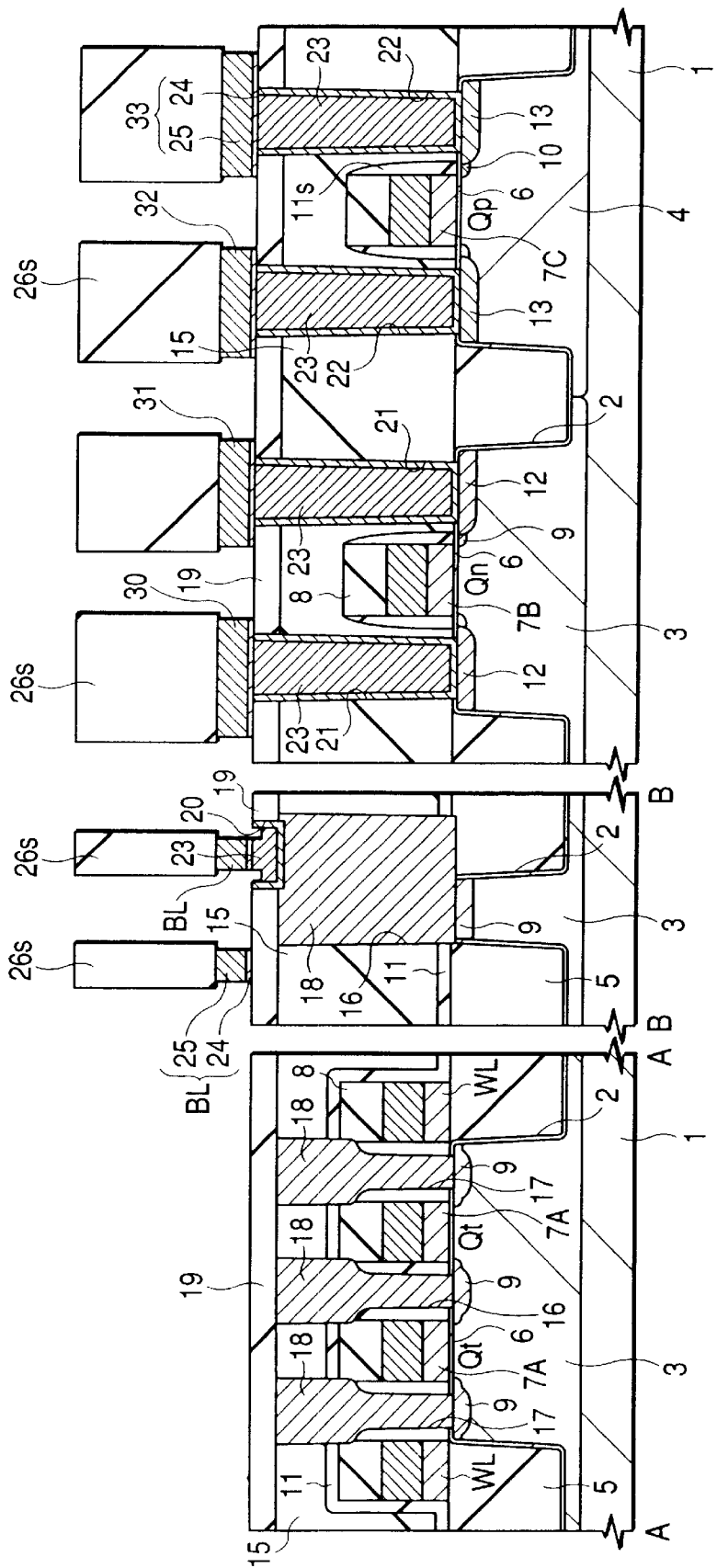
FIG. 20 is a cross-sectional view through the key parts of the semiconductor substrate that shows the method of fabricating the DRAM which is one embodiment of this invention.
Figure 21:
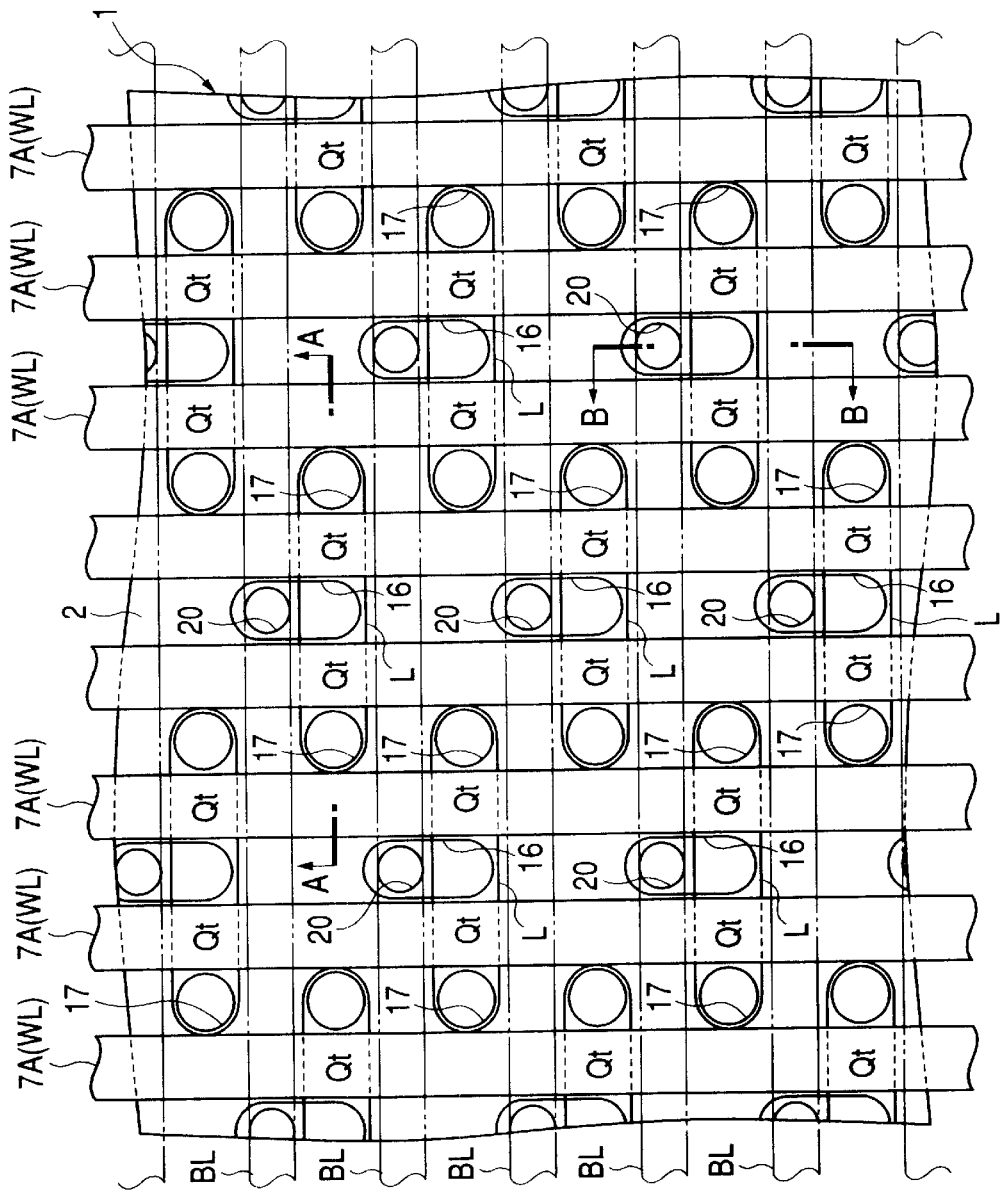
FIG. 21 is a plan view of the semiconductor substrate that shows the method of fabricating the DRAM which is one embodiment of this invention.

As shown in FIGS. 20 and 21, narrowed photoresist masks 26s are used in patterning W film 25 and WN film 24 by dry etching to form bit lines BL over silicon oxide film 19 in the storage section and wires 30 to 33 over silicon oxide film 19 in the peripheral circuits. Etching of W film 25 and WN film 24 is, to a certain degree, isotropic. Both sidewalls of bit lines BL (and wires 30 to 33) are thus etched, and bit lines BL with a width of 0.1 µm or less, which is narrower than the line widths of photoresist masks 26s, can in this way be obtained. In addition, since W film 25 and WN film 24 are etched at almost the same rate, bit lines BL (and wires 30 to 33) can be formed with a high degree of accuracy in terms of size. Similarly, since the Mo film and Mo-compound film are etched at almost the same rate as the W film 25, bit lines BL (and wires 30 to 33) can still be formed with a high degree of accuracy in terms of size, even when WN film 24 is replaced by an Mo film or an Mo-compound film.

Figure 22:
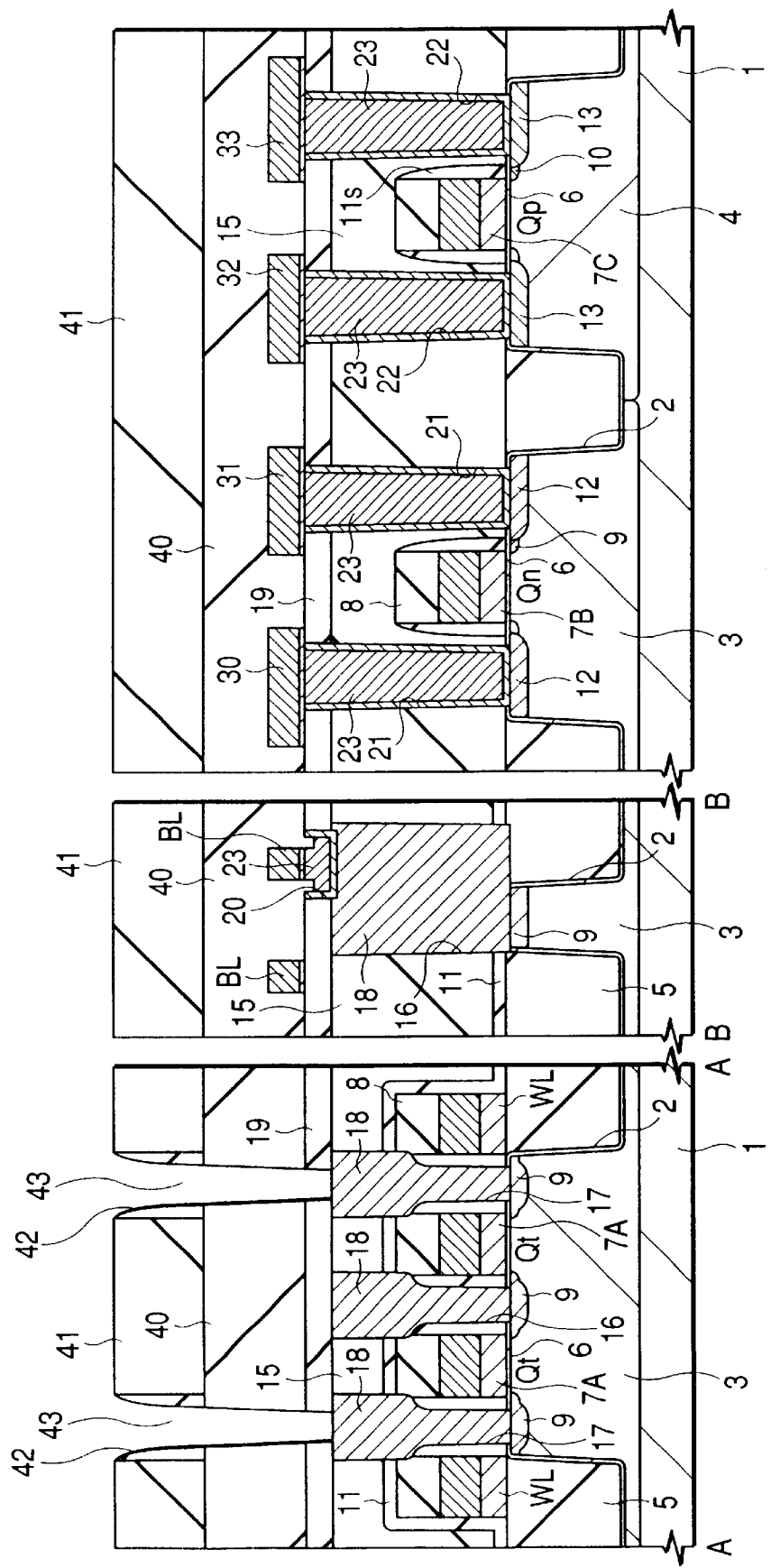
FIG. 22 is a cross-sectional view through the key parts of the semiconductor substrate that shows the method of fabricating the DRAM which is one embodiment of this invention.

After photoresist masks 26s have been entirely removed by the ashing process, interlayer-insulating film 40 is formed over bit lines BL and wires 30 to 33, as is shown in FIG. 22. Interlayer-insulating film 40 is formed by the same process as was used to form interlayer-insulating film 15.

Figure 23:
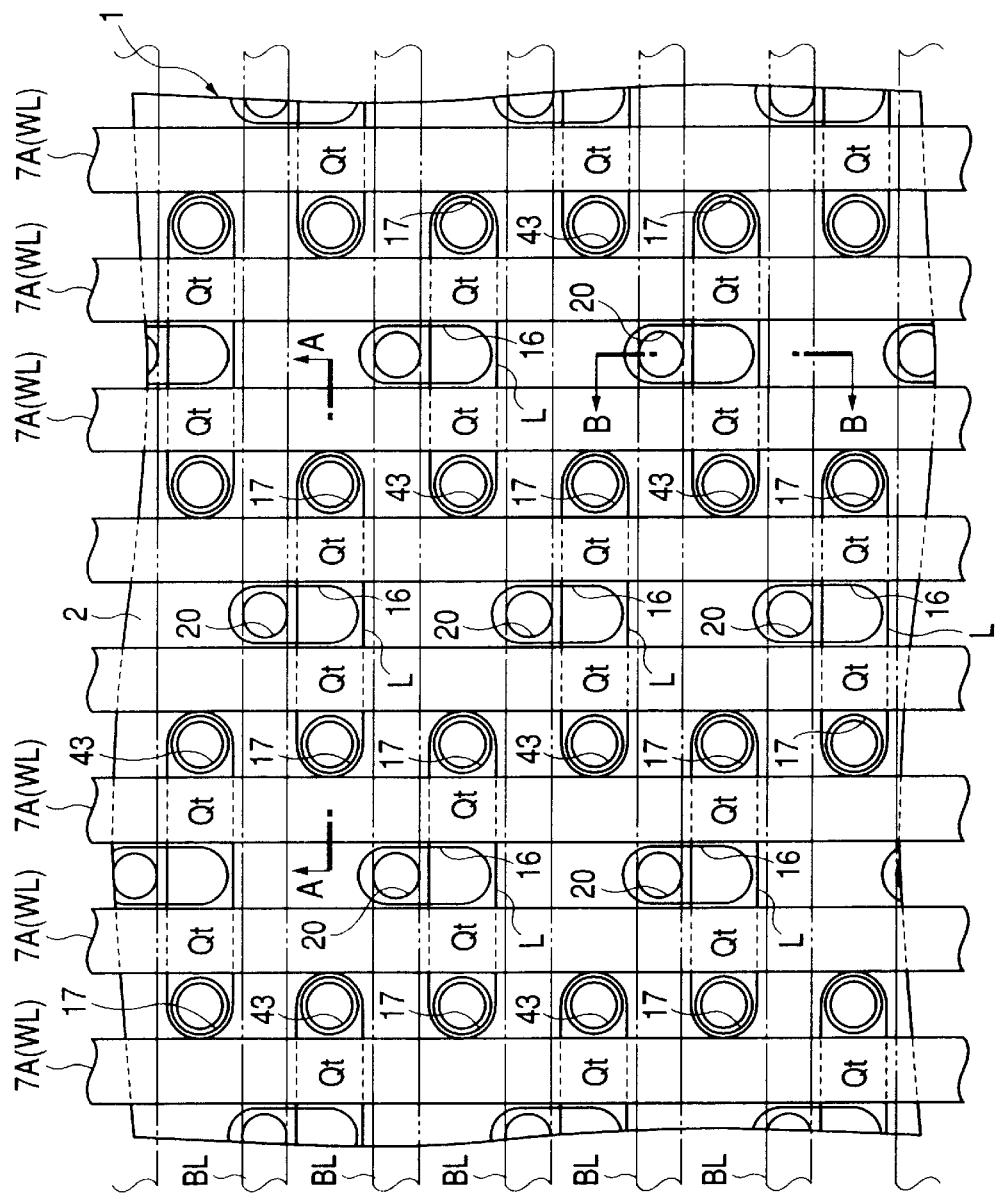
FIG. 23 is a plan view of the semiconductor substrate that shows the method of fabricating the DRAM which is one embodiment of this invention.

As shown in FIGS. 22 and 23, through holes 43 are formed above contact holes 17 by etching of interlayer-insulating film 40 and silicon oxide film 19 in the storage section. Polysilicon film 41 and sidewall spacers 42 made of a polysilicon film, which are formed over interlayer-insulating film 40, are used as etching-resistant masks. As earlier described, since bit lines BL are narrowed to 0.1 µm or less, and the spaces between the bit lines are thus widened, a sufficient margin against short-circuit with plug 44, which has been embedded in through hole 43 that was formed in the space between bit lines BL, can thus be ensured.

Figure 24:
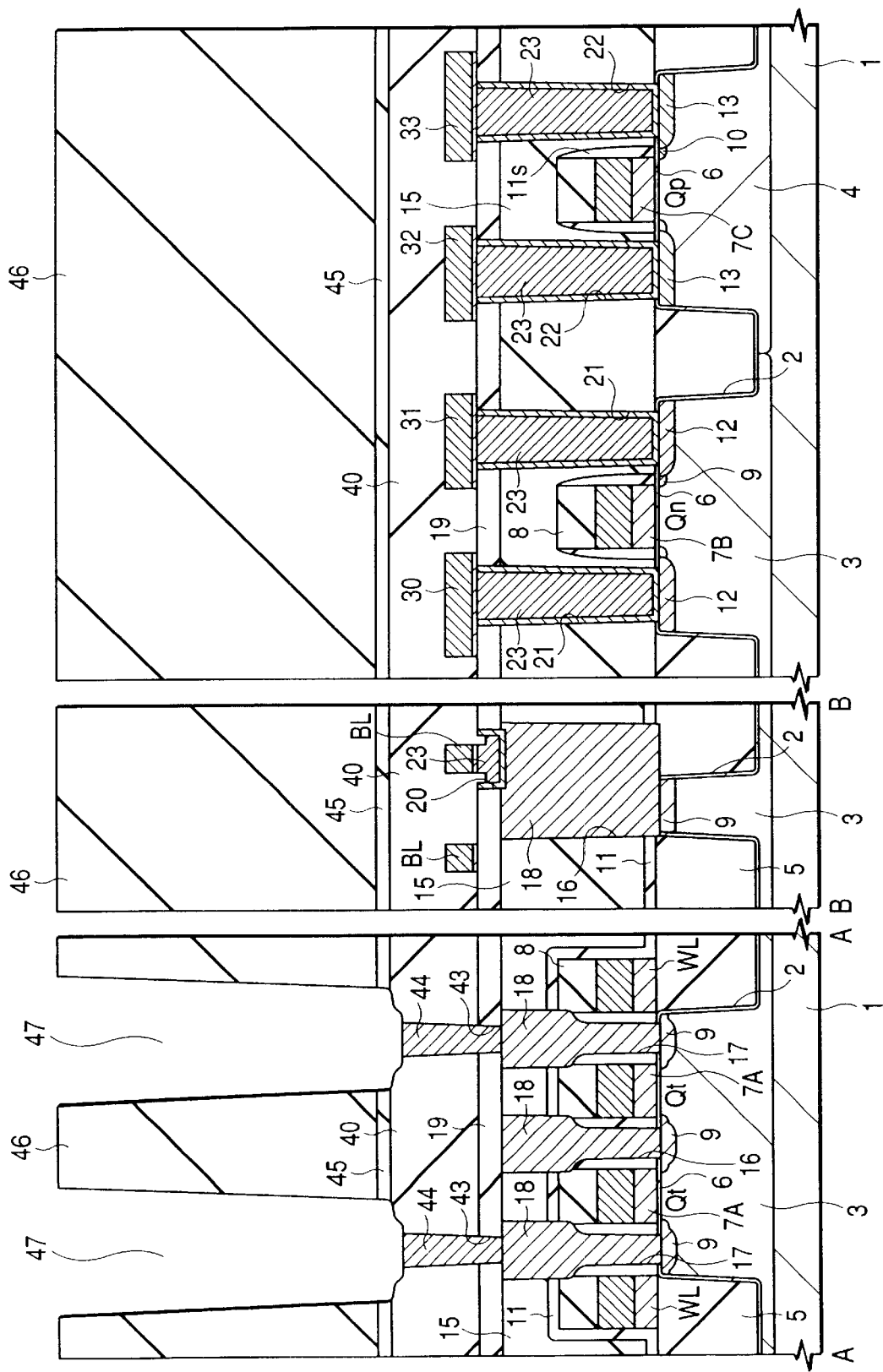
FIG. 24 is a cross-sectional view through the key parts of the semiconductor substrate that shows the method of fabricating the DRAM which is one embodiment of this invention.

After polysilicon film 41 and sidewall spacers 42 have been removed by dry etching, plug 44 is formed in through hole 43, as shown in FIG. 24. A low-resistance polysilicon film doped with P (phosphorus) is deposited in through hole 43 and over interlayer-insulating film 40 by CVD to form plug 44. Any superfluous polysilicon film over interlayer-insulating film 40 is removed by dry etching (or CMP).

Silicon nitride film 45 is deposited over interlayer-insulating film 40 by CVD, and silicon oxide film 46 is then deposited over silicon nitride film 45 by CVD. To form deep grooves 47 over through holes 44, silicon oxide film 46 and silicon nitride film 45 are then etched, in the storage section, with a photoresist film (not shown) as the mask.

Figure 25:
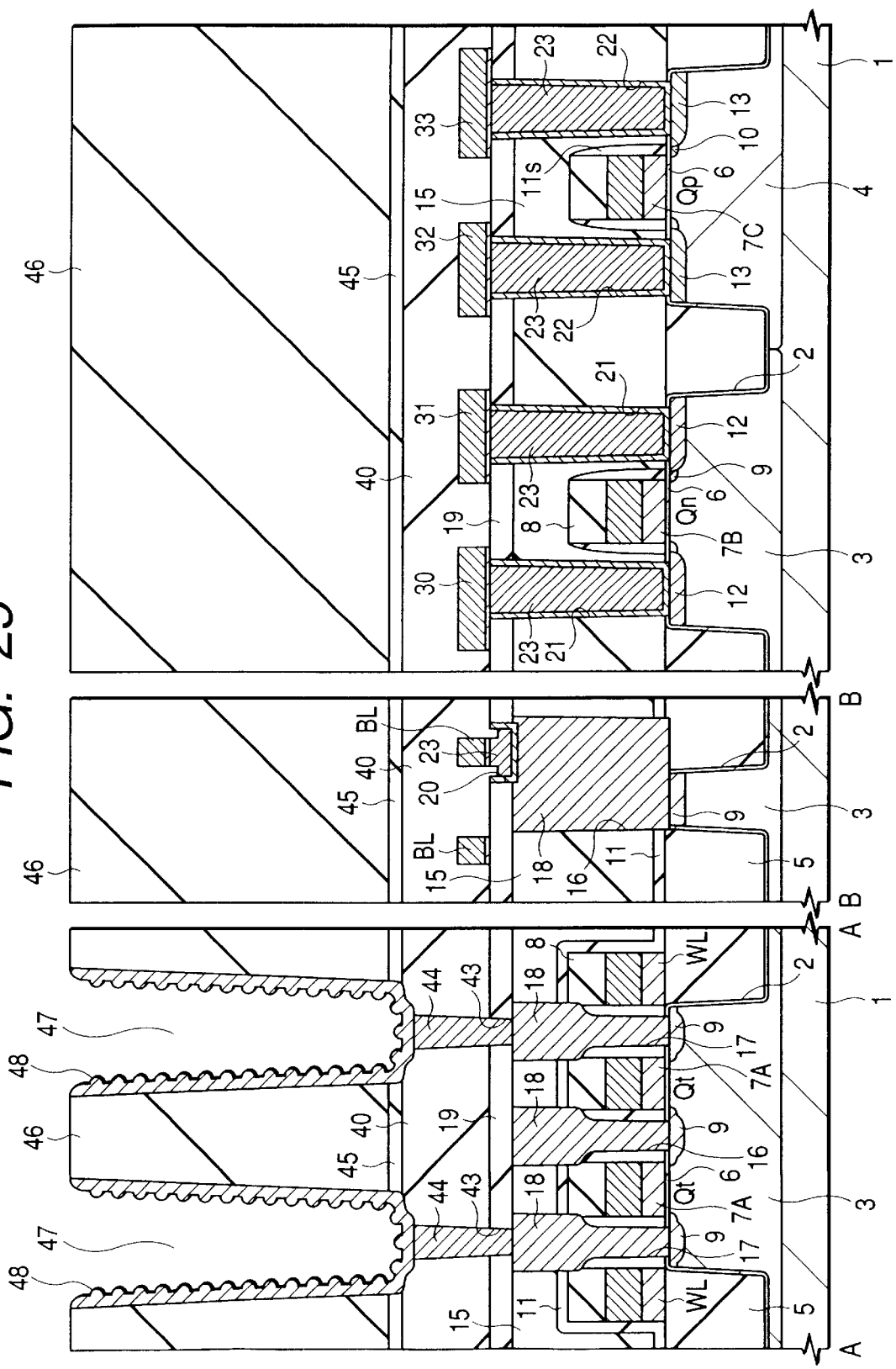
FIG. 25 is a cross-sectional view through the key parts of the semiconductor substrate that shows the method of fabricating the DRAM which is one embodiment of this invention.

As shown in FIG. 25, lower electrodes 48 of data-storage capacitors C are formed of polysilicon films on the sidewalls in grooves 47. To form lower electrodes 48, an amorphous silicon film (not shown) which has been doped with P (phosphorus) is deposited by CVD in grooves 47 and over silicon oxide film 46. Any superfluous amorphous silicon-film over silicon oxide film 46 is removed by dry etching.

The surface of the amorphous silicon film that remains in grooves 47 is wet-cleaned by using some kind of hydrofluoric acid. The amorphous silicon film is then exposed to a low-pressure atmosphere that supplies monosilane ($SiH_4$) to its surface. Substrate 1 is then thermally processed to crystallize the surface of the amorphous silicon film into grains of silicon. In this way, lower electrodes 48 are formed of grainy polysilicon film. Since a grainy polysilicon film has a large surface area, it is possible to increase the storage capacitance of the refined data-storage capacitor.

Figure 26:
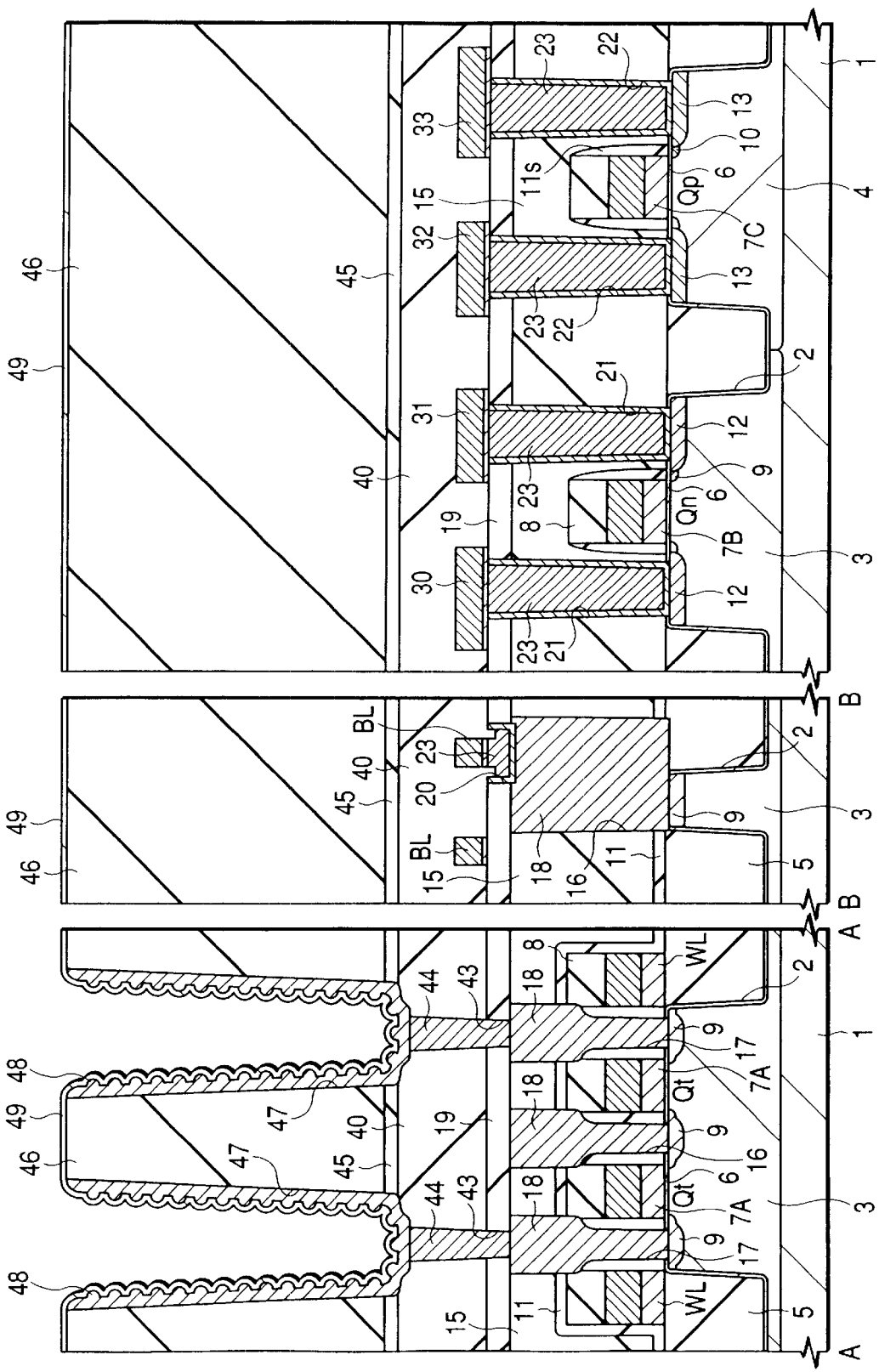
FIG. 26 is a cross-sectional view through the key parts of the semiconductor substrate that shows the method of fabricating the DRAM which is one embodiment of this invention.

As shown in FIG. 26, a $Ta_2O_5$ (tantalum pentoxide) film is deposited, by CVD, over the surface of lower electrodes 48 formed in grooves 47 and over the surface of silicon oxide film 46 outside grooves 47. This film forms the capacitance-insulating film 49 of data-storage capacitor C.

Substrate 1 is thermally processed in an atmosphere of oxygen to improve and crystallize the $Ta_2O_5$, film. This thermal processing produces a high-quality $Ta_2O_5$ film, with a dielectric constant of 20 to 25, and with better current-leakage characteristics. This thermal processing, which is used to improve and crystallize the $Ta_2O_5$ film is carried out in an atmosphere of oxygen and at temperatures in the range from 750 to 800° C. Although bit lines BL below are exposed to high temperatures by this treatment, no wiring break occurs. This is because bit lines BL are made of two-layered conductive films, in which W film 25 has been deposited over WN film 24, and fewer atoms of W are thus diffused across the interface between W film 25 and WN film 24, within crystal grains, and at grain boundaries in W film 25, as earlier described, and no tensile stress exists in W film 25.

Capacitance-insulating film 49 of data-storage capacitor C can also be made of a film which is mainly comprised of a substance with a high-dielectric constant or a ferroelectric substance with a perovskite or complex-perovskite crystal structure, such as PZT, PLT, PLZT, $PbTiO_3$, $SrTiO_3$, $BaTiO_3$, BST, SBT, or $Ta_2O_5$. Even when a film of a substance with a high-dielectric constant or of a ferroelectric substance, such as is listed above, is used, high-temperature thermal processing is still required to improve and crystallize the film. In the same way as described above, however, the high-temperature thermal processing will still not cause wiring breaks in bit lines BL.

Figure 27:
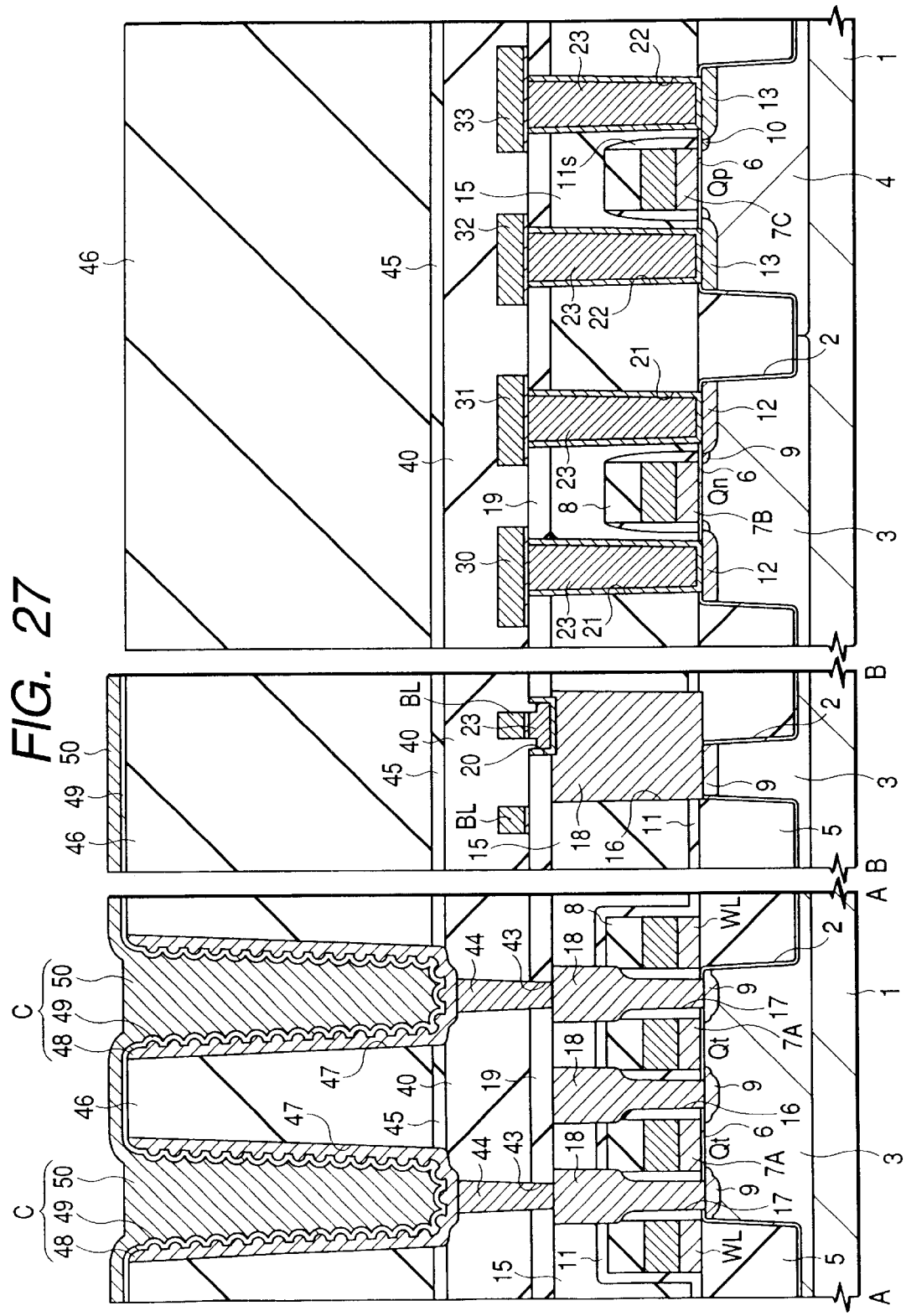
FIG. 27 is a cross-sectional view through the key parts of the semiconductor substrate that shows the method of fabricating the DRAM which is one embodiment of this invention.

As shown in FIG. 27, after the TiN film has been deposited in grooves 47 and over capacitance-insulating film 49 by a series of CVD and sputtering processes, the TiN and $Ta_2O_5$ films are patterned by dry etching with a photoresist film (not shown) as a mask. The above processes form the data-storage capacitor C, using upper electrode 50 made of the TiN film, capacitance-insulating film 49 made of the $Ta_2O_5$ film, and lower electrode 48 made of a polysilicon film. The DRAM memory cell is thus configured by memory-cell-selecting MISFET Qt and data-storage capacitor C that is connected, in series, to memory-cell-selecting MISFET Qt.

Silicon oxide film 50 is then deposited over data-storage capacitor C by CVD, and two or so layers of Al are formed as wiring (not shown) over silicon oxide film 50 to complete the DRAM that represents this embodiment and is shown in FIGS. 2 and 3.

This invention was described in detail above on the basis of an embodiment. However, this invention is not restricted to this embodiment; and, various modifications are possible without deviating from the essential points of the invention.

This embodiment was used to describe the situation in which wiring breaks in DRAM bit lines are to be prevented. Since the gate electrodes of the MISFET will be made yet finer, with gate lengths of 0.1 μm or less, as LSIs are miniaturized and more densely integrated, the wiring breaks of gate electrodes made of conductive films that include a W film will still be a problem. Even in this case, the wiring breaks of the gate electrodes can still be effectively prevented by forming the gate electrode with a WN film having a lattice constant which is close to that of W, a two-layered conductive film in which the W film is deposited over an Mo film or an Mo-compound film, or a polymetal-structured conductive film in which a polysilicon film is formed under the two-layered conductive film.

Typical advantages obtained from the invention disclosed in this application are briefly described in the following paragraph.

This invention effectively prevents wiring breaks in bit lines of fine width, and the DRAM-memory size can thus be reduced to implement a larger-scale integrated memory.

What is claimed is:

1. A semiconductor integrated circuit device comprising:
   memory cells, which are located at the intersections of word lines that extend in a first direction of the major surface of a semiconductor substrate and bit lines that extend in a second direction that intersects the first direction at a right angle, and which include;
   a memory-cell-selecting MISFET with a gate electrode that is configured in a single unit with the word line; and
   a data-storage capacitor connected to the MISFET in series;
   characterized in that the bit lines are formed over the memory-cell-selecting MISFET via a first insulating film and the data-storage capacitor is formed over the bit lines via a second insulating film;
   wherein the bit lines are made of a first conductive film made of molybdenum or a molybdenum compound and a second conductive film made of tungsten that is deposited on the first conductive film.

2. A semiconductor integrated circuit device, as defined in claim 1, wherein the first conductive film is a molybdenum film, a molybdenum nitride film, a molybdenum boron film, or a molybdenum carbide film.

* * * * *